United States Patent [19]
Nishimura et al.

[11] Patent Number: 5,541,871
[45] Date of Patent: Jul. 30, 1996

[54] NONVOLATILE FERROELECTRIC-SEMICONDUCTOR MEMORY

[75] Inventors: Kiyoshi Nishimura; Hideki Hayashi; Jun Muramoto; Takaaki Fuchikami; Hiromi Uenoyama, all of Kyoto, Japan

[73] Assignee: Rohm Co., Ltd., Japan

[21] Appl. No.: 374,246

[22] Filed: Jan. 18, 1995

[30] Foreign Application Priority Data

Jan. 18, 1994 [JP] Japan .................................. 6-003798
May 18, 1994 [JP] Japan .................................. 6-104109
Dec. 22, 1994 [JP] Japan .................................. 6-319939

[51] Int. Cl.$^6$ .............................. G11C 11/22; G11C 7/00
[52] U.S. Cl. ........................ 365/145; 365/117; 257/295
[58] Field of Search .................................... 365/117, 145, 365/149; 257/295

[56] References Cited

U.S. PATENT DOCUMENTS

| | | | |
|---|---|---|---|
| 4,873,664 | 10/1989 | Eaton, Jr. | 365/145 |
| 4,888,733 | 12/1989 | Mobley | 365/145 |
| 5,303,182 | 4/1994 | Nakao | 365/145 |
| 5,365,094 | 11/1994 | Takasu | 257/295 |

Primary Examiner—David C. Nelms
Assistant Examiner—Son Mai
Attorney, Agent, or Firm—Merchant, Gould, Smith, Edell, Welter & Schmidt

[57] ABSTRACT

Nonvolatile memory with simple structure where recorded information can be read without destroy: Voltage is impressed to control gate CG and channel is grounded at writing operation. Ferroelectric layer 32 is polarized in accordance with whether the applied voltage is larger than threshold voltage of the memory device. Control gate voltage $V_{CC}$ to make channel is little when the ferro-electric layer 32 is polarized with control gate side being positive (polarized with second status). Control gate voltage $V_{CG}$ to make channel is large when the ferroelectric layer 32 is polarized with control gate side being negative (polarized with first status). The reference voltage $V_{ref}$ is impressed to the control gate CG at reading operation. Large drain current flows when the ferroelectric layer is polarized with second status and little drain current flows when the ferroelectric layer is polarized with first status. Recorded information can be read by detecting the drain current. By this reading operation, polarization status is not destroyed.

21 Claims, 21 Drawing Sheets

FIG. 6

APPLIED VOLTAGES WHEN MEMORY DEVICE M22 IS SELECTED

| STANDBY MODE | WRITE OPERATION MODE |
|---|---|
| SL1: open<br>CGL1:Vref<br>CGL2:Vref<br>CGL3:Vref | SL1: open<br>CGL1:Vref<br>CGL2:VDD/GND<br>CGL3:Vref |
| SL2: open<br>CGL1:Vref<br>CGL2:Vref<br>CGL3:Vref | SL2: GND<br>CGL1:Vref<br>CGL2:VDD/GND<br>CGL3:Vref |
| SL3: open<br>CGL1:Vref<br>CGL2:Vref<br>CGL3:Vref | SL3: open<br>CGL1:Vref<br>CGL2:VDD/GND<br>CGL3:Vref |

READ OPERATION MODE
POSSIBLE DRAIN CURRENT
(DRAIN CURRET CAPACITY)

| | |
|---|---|
| SL1: open<br>CGL1:Vref<br>CGL2:Vref<br>CGL3:Vref | I=0  (M11)<br>I=0  (M21)<br>I=0  (M31) |
| SL2: GND<br>CGL1:Vref<br>CGL2:Vref<br>CGL3:Vref | I=I0max or 0  (M12)<br>I=I0max or 0  (M22)<br>I=I0max or 0  (M32) |
| SL3: open<br>CGL1:Vref<br>CGL2:Vref<br>CGL3:Vref | I=0  (M13)<br>I=0  (M23)<br>I=0  (M33) |

JUDGING CIRCUIT FOR DRAIN CURRENT

READ OPERATION MODE

FIG. 13

| W/R | WRITE | READ | STAMDBY |
|---|---|---|---|
| IN | H | L | — |
| OUT | HorL | — | — |
| C1 | — | HorL | — |
| C2 | L | L | L |
| L1 | H | H | L |
| L2 | L | L | L |
| | H | H | L |

WRITE TO M22

READ FROM M22

WRITE MODE

WRITE MODE

READ OPERATION MODE

READ OPERATION MODE

STANDBY MODE

NONVOLATILE FERROELECTRIC-SEMICONDUCTOR MEMORY

BACKGROUND OF INVENTION

1. Field of the Invention

The present invention relates to a nonvolatile memory.

2. Description of the Prior Art

Recently, a nonvolatile memory device using ferroelectric material has been getting attention in the industry, and several structures of the device and circuit configurations for the device have been proposed. FIG. 1 shows a structure of a nonvolatile memory cell which is disclosed in U.S. Pat. No. 4,888,733. In the figure, a transistor 18 and a transistor 20 are connected to both sides of a ferroelectric capacitor 2. Gates of the transistor 18 and the transistor 20 are connected with a word line 8. Also, a source of the transistor 18 is connected to a bit line 14, and a source of the transistor 20 is connected with a bit line 16.

The ferroelectric capacitor 2 is polarized when a certain voltage is applied between the bit line 14 and the bit line 16 after turning on the transistor 18 and the transistor 20. Polarization of the ferroelectric capacitor 2 is maintained even after removing the voltage. The direction of polarization can he turned over by applying a voltage in the opposite direction. Accordingly, the ferroelectric capacitor 2 is able to store data under nonvolatile conditions.

When reading out the stored data from the capacitor, a certain voltage is applied to the ferroelectric capacitor 2. Upon applying the voltage to the ferroelectric capacitor 2, memorized polarization can be known by detecting whether the polarization turns over or not. In other words, memorized polarization can be known by detecting a current which flows by turning over the polarization. Since the memorized polarization is changed (i.e. stored data is erased) when read out the data from the ferroelectric capacitor 2, the same data (as the stored data) is written into the ferroelectric capacitor immediately after reading to maintain the polarization direction.

Furthermore, another nonvolatile memory device utilized ferroelectric capacitors consisting of 2 ferroelectric capacitors and 2 transistors is proposed (disclosed in U.S. Pat. No. 4,873,664).

However, the above mentioned nonvolatile memory devices have following issues to resolve.

First, the memory device disclosed in U.S. Pat. No. 4,888,733 requires 2 transistors besides the ferroelectric capacitor for each cell. Therefore, the structure of the memory device is complicated. In the meantime, the memory device disclosed in U.S. Pat. No. 4,873,664 requires 2 transistors and 2 ferroelectric capacitors for each cell, so that construction of the device is very complex.

Further, since the stored data in the ferroelectric capacitor is erased when reading out the data as described above, the same data (as the stored data) must be re-written into the capacitor, so that control of the read operation is very complex.

SUMMARY OF THE INVENTION

It is an object of the present invention to provide a nonvolatile memory device which can read out stored data under nondestructive conditions with a simple structure.

Nonvolatile memory is formed by nonvolatile memory devices connected in a matrix in accordance with the present invention:

wherein said nonvolatile memory devices comprise, a source region of first conductive type and a drain region of first conductive type, a channel region of second conductive type formed between the source and the drain region, a memory gate formed on the channel region insulated from the channel region, a ferroelectric layer formed on the memory gate, and a control gate formed on the ferroelectric layer, and wherein said nonvolatile memory comprises, a drain line which connects the drain regions of the nonvolatile memory devices in the same line of the matrix, a control gate line which connects the control gates of the nonvolatile memory devices in the same row of the matrix, a source line which connects the source regions and channel regions of the nonvolatile memory devices in the same column of the matrix.

While the novel features of the invention are set forth in a general fashion, both as to organization and content, the invention will be better understood and appreciated, along with other objects and features thereof, from the following detailed description taken in conjunction with the drawings.

BRIEF DESCRIPTION OF THE DRAWINGS

FIG. 6 is a table showing the voltage applied to the circuitry of FIG. 2 in each operational mode.

FIG. 13 is a table showing the voltage applied to the circuitry of the FIG. 10 in each operational mode.

DESCRIPTION OF THE PREFERRED EMBODIMENTS

Figure 3:
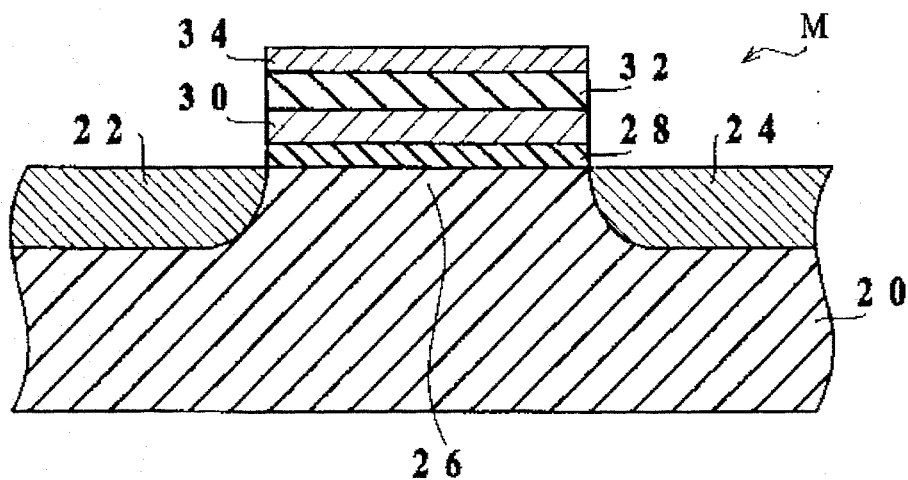
FIG. 3 shows the structure of non-volatile memory device M used in the non-volatile memory of FIG. 2.

FIG. 3 shows the structure of a non-volatile memory element M in accordance with a preferred embodiment of the present invention. A source region 22 and a drain region 24 are formed on a silicon substrate 20. On a channel region 26 is provided an insulation layer 28 made of a material such as silicon oxide $SiO_2$ or silicon nitride SiN. On the insulation layer 28 is provided a lower conductor layer (memory gate) 30 made of a material such as platinum. On the lower conductor layer 30 is provided a ferroelectric layer 32 made of a material such as $PbZr_xTi_{1-x}O_3$(PZT), and an upper conductor layer (control gate) 34 made of a material such as platinum is provided on the ferroelectric layer. As a material for the lower conductor layer 30 and the upper conductor layer 34, the can be used an oxide conductor such as RuOx, IrOx, and ITO, or a metal such as Pb, Au, Ag, Al, and Ni other than the aforementioned material of platinum.

Figure 4:
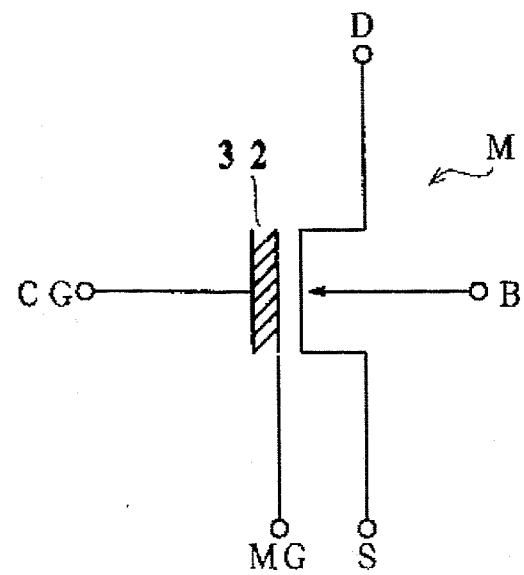
FIG. 4 shows an electrical representation symbol for the non-volatility memory device M of FIG. 3.

The non-volatile memory M shown in FIG. 3 can be expressed by a symbol as shown in FIG. 4. The upper conductor layer 34 is connected to a control gate electrode CG, while the lower conductor layer 30 is connected to a memory gate electrode MG. The source region 22 is connected to a source electrode S, while the drain region 24 is connected to a drain electrode D.

In recording data in the non-volatile memory M, a voltage is applied across the control gate electrode CG and the memory gate electrode MG. With the voltage applied, the ferroelectric substance 32 is polarized, and the state of polarization remains after the voltage is removed. By changing the polarity of the voltage to be applied, two different states of polarization can be obtained. For instance, when there is applied to the memory gate electrode MG a voltage lower than a voltage applied to the control gate electrode CG, the ferroelectric substance 32 is polarized making the control gate electrode CG have a negative polarity (polarized in a first state). Conversely, when a higher voltage is applied to the memory gate electrode MG, the ferroelectric substance 32 is polarized making the control gate electrode CG have a positive polarity (polarized in a second state). Thus the two states can be recorded in a non-volatile manner.

Figure 5A:
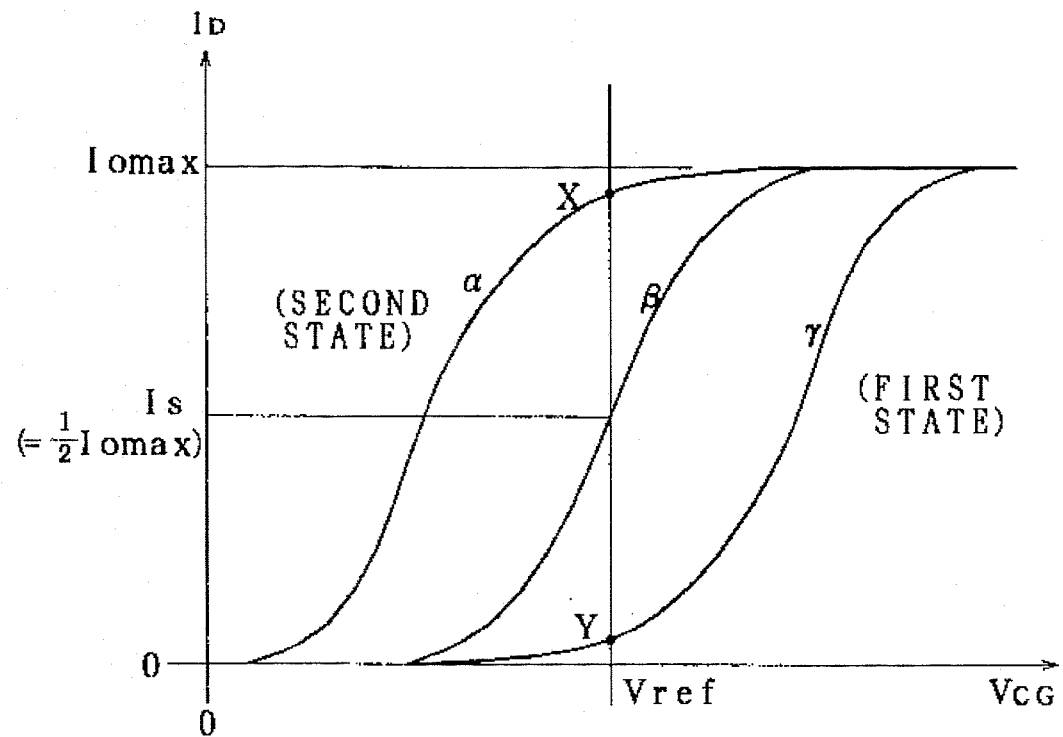
FIG. 5A shows an electric characteristic of the non-volatile memory device M.
Figure 5B:
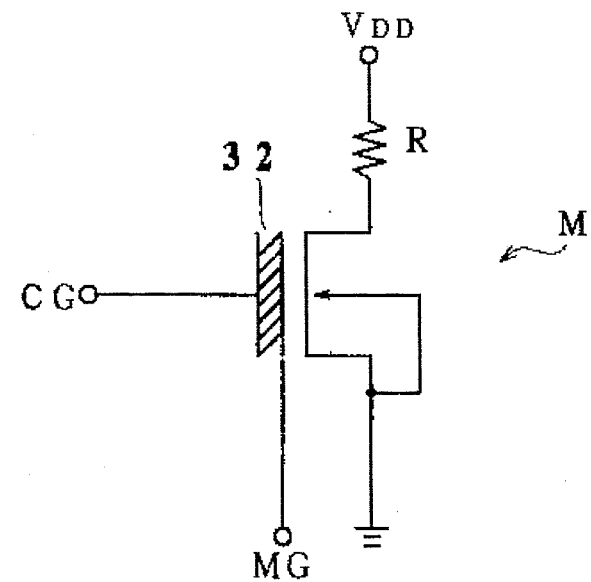
FIG. 5B shows a test circuit in which the electrical characteristic of the non-volatile memory is measured.

FIG. 5A shows the result of measuring the characteristic of the non-volatile memory M connected in a manner as shown in FIG. 5B. In FIG. 5A, a characteristic curve exhibits how a drain current $I_D$ varies when the control gate CG and the memory gate MG are short-circuited and a voltage applied to the control gate CG is varied. It is to be noted that the ferroelectric layer 32 has a capacitance much greater than the capacitance of the insulation layer 28. Therefore, a relationship (characteristic) between the control gate electrode CG and the drain current in a condition where the ferroelectric layer 32 is not polarized can be almost approximated to the characteristic in the case where the control gate electrode CG and the memory gate electrode MG are short-circuited.

As is apparent from the characteristic curve, when both ends of the ferroelectric layer 32 is short-circuited (equivalent to the case where the ferroelectric substance is not polarized as described above), it can be discovered that the non-volatile memory M has a threshold voltage $V_{ref}$. In other words, the non-volatile memory M is constructed so that the non-volatile memory M has an arrangement of electric charge equivalent to a voltage application achieved by making the memory gate MG have a negative polarity and making a substrate (channel) B have a positive polarity without applying any external voltage. It is to be noted that the threshold voltage $V_{ref}$ can be adjusted by selecting an operating constant in the manufacturing stage.

By utilizing the above-mentioned characteristic, a write operation is enabled without using the memory gate electrode MG. For instance, when the substrate (channel) B is grounded and a voltage higher than the threshold voltage $V_{ref}$ is applied to the control gate CG, a voltage is generated across both the ends of the ferroelectric layer 32 according to a ratio of potential division depending on the capacitance of the insulation layer 28, the capacitance of the ferroelectric layer 32, and other factors. With the above-mentioned operation, the ferroelectric substance 32 is polarized making the control gate electrode CG have the negative polarity (polarized in the first state). Conversely, when the substrate (channel) B is grounded and a ground potential is applied to the control gate CG, the ferroelectric substance 32 is polarized making the control gate electrode CG have the positive polarity (polarized in the second state). Thus, without using the memory gate MG, the two states can be recorded in a non-volatile manner.

When the polarization is achieved by making the control gate electrode CG have the positive polarity (polarized in the second state), the voltage at the control gate electrode CG required for forming a channel is reduced. When the polarization is achieved by making the control gate electrode CG have the negative polarity (polarized in the first state), the voltage at the control gate electrode CG required for forming the channel is increased. Therefore, by applying a voltage between both the voltages to the control gate electrode CG, the recorded data can be read depending on whether the channel is formed or not.

The above-mentioned relationship will be described with reference to FIGS. 5A and 5B. In FIG. 5A, the curve 13 shows the characteristic of the drain current $I_D$ plotted against a control gate voltage $V_{CG}$ in the case where the control gate electrode CG and the memory gate electrode MG are short-circuited. When the control gate voltage $V_{CG}$ is increased, the drain current $I_D$ increases. When the control gate voltage $V_{CG}$ is further increased, the increase of the drain current stops at an established maximum drain current $I_{OMAX}$ depending on a resistor R.

A curve α exhibits the characteristic in the case where the ferroelectric substance 32 is polarized making the control gate electrode CG have the positive polarity (polarized in the second state). The curve α exhibits a tendency similar to that of the curve β, however, the drain current is formed at a smaller control gate voltage $V_{CG}$ due to the influence of the polarization of the ferroelectric substance 32. Furthermore, the drain current reaches the established maximum drain current $I_{OMAX}$ at a smaller control gate voltage $V_{CG}$.

A curve γ exhibits a characteristic in the case where the ferroelectric substance 32 is polarized making the control gate electrode CG have the negative polarity (polarized in the first state). The curve γ exhibits a tendency similar to that of the curve β, however, the drain current is formed at a higher control gate voltage $V_{CG}$ due to the influence of the polarization of the ferroelectric substance 32. Furthermore, the drain current reaches the established maximum drain current $I_{OMAX}$ at a higher control gate voltage $V_{CG}$.

In a read mode, the aforementioned threshold voltage $V_{ref}$ is applied as a reference voltage to the control gate CG. In the above-mentioned mode, depending on whether the drain current $I_D$ is greater (a point X) or smaller (a point Y) than a reference current $I_S$, the stored data can be perceived. It is to be noted that the read operation can be also performed by applying a voltage different from the threshold voltage $V_{ref}$ as a reference voltage so long as the reference voltage is a voltage capable of discriminating between the point X and the point Y. However, by using a voltage substantially equal to the threshold voltage $V_{ref}$ as a reference voltage as in the above-mentioned case, the influence of the external application voltage exerted on both the ends of the ferroelectric layer 32 in the read mode is not exerted (because the voltage is offset by the threshold voltage $V_{ref}$), and the read operation can be performed without changing the contents of storage data.

Figure 2:
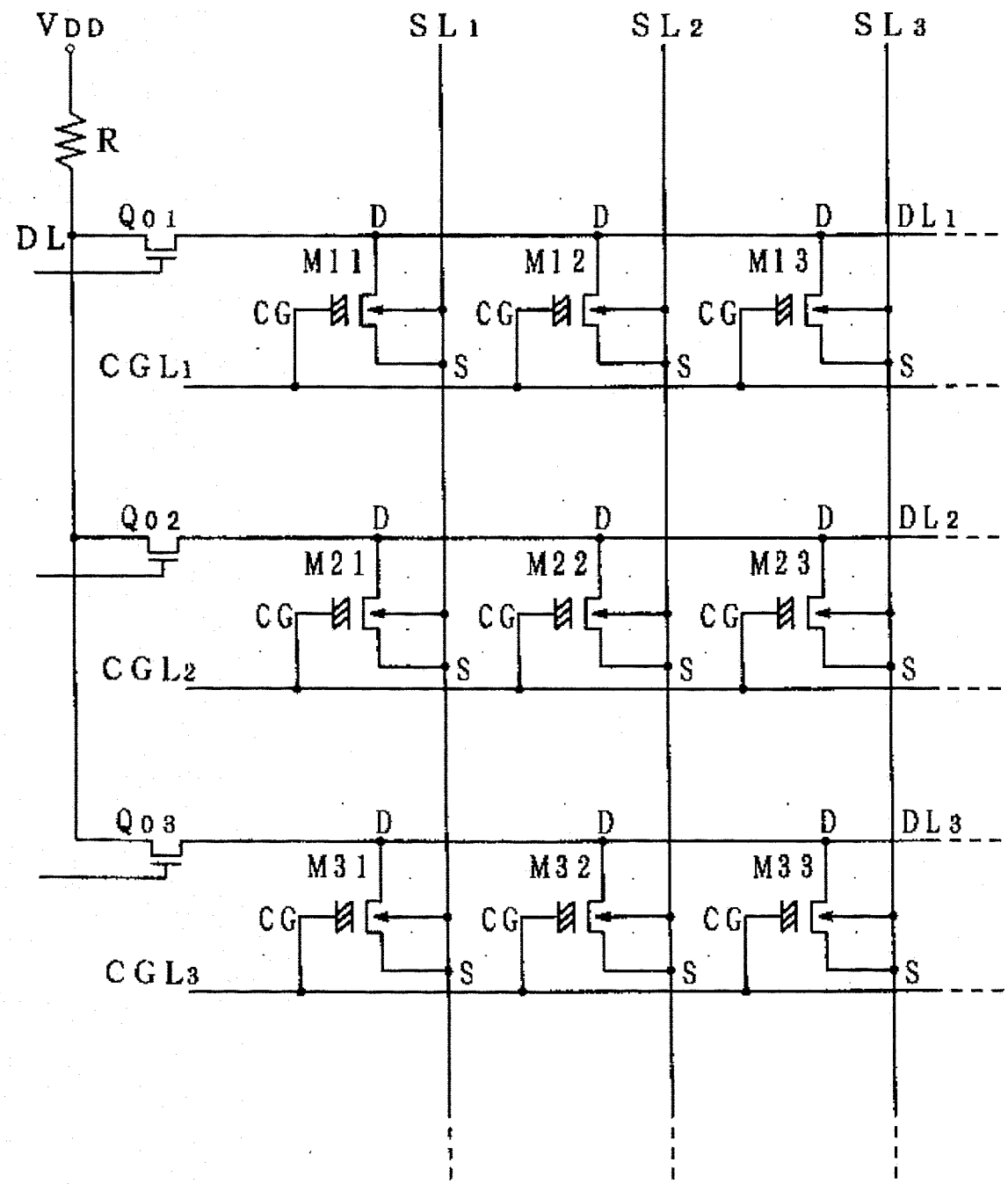
FIG. 2 shows circuitry of non-volatile memory device in an embodiment of the present invention.

FIG. 2 shows a non-volatile memory constructed by connecting the non-volatile memory devices (memory elements) M shown in FIG. 4. Drains D of memory devices arranged in an identical row of each column (e.g., $M_{11}$, $M_{12}$, $M_{13}$, ...) are connected to drain lines $DL_1$, $DL_2$, $DL_3$, ... The drain lines $DL_1$, $DL_2$, $DL_3$, ... are connected to a unified drain line DL respectively via transistors $Q_{01}$, $Q_{02}$, $Q_{03}$, ... which serve as drain switching means. The unified drain line DL is connected to a power voltage $V_{DD}$ via the resistor R.

Control gate electrodes CG of memory devices arranged in an identical row of each column (e.g., $M_{11}$, $M_{12}$, $M_{13}$, ...) are connected to control gate lines $CGL_1$, $CGL_2$, $CGL_3$, ... On the other hand, source electrodes S and the substrates (channels) B of memory devices arranged in an identical column of each row (e.g., $M_{12}$, $M_{22}$, $M_{32}$, ...) are connected to source lines $SL_1$, $SL_2$, $SL_3$, ... The memory gates of the elements are connected to nothing, i.e., the memory gates are floated.

FIG. 6 shows a table of voltages to be applied to respective lines in the write mode, read mode, and standby mode when the memory device $M_{22}$ is selected as a selected memory device.

In the write mode, only the source line $SL_2$ is made to have the ground potential, and the other source lines $SL_1$, $SL_3$, ... are floated. Furthermore, a voltage (5 V ($V_{DD}$) or the ground potential) of data to be recorded is applied only to the control gate line $CGL_2$, and the reference voltage (threshold voltage) $V_{ref}$ is applied to the other control gate lines $CGL_1$, $CGL_3$, ...

Since the source lines $SL_1$, $SL_3$, ... are floated, no matter whether or not a voltage is applied to the control gate CG, no voltage is generated across the ends of the ferroelectric layer 32 of the memory devices $M_{11}$, $M_{21}$, $M_{31}$, ..., $M_{13}$, $M_{23}$, $M_{33}$, ... connected to the source lines. Therefore, the influence of the write operation is not given to these elements. Since the source line $SL_2$ is made to have the ground potential, no voltage is generated across the ends of the ferroelectric layer 32 of the memory devices $M_{12}$, $M_{22}$, $M_{32}$, ... connected to the source line. Since the reference voltage $V_{ref}$ is applied to the control gates CG of the memory devices $M_{12}$ and $M_{32}$ in the above place, no voltage is generated across the ends of the ferroelectric layer 32. To the control gate CG of the memory device $M_{22}$ the voltage $V_{DD}$ or the ground potential is applied. Therefore, a voltage is generated across both ends of the ferroelectric layer 32 of the memory device $M_{22}$.

Thus the voltage corresponding to the data to be recorded is applied only to the ferroelectric layer 32 of the memory device $M_{22}$ to achieve the polarization. In other words, the ferroelectric layer 32 of the memory device $M_{22}$ is polarized to be put into the first state or the second state according to the data to be recorded.

In the read mode, only the source line $SL_2$ is made to have the ground potential, and the other source lines $SL_1$, $SL_3$, ... are floated. Further, the reference voltage $V_{ref}$ is applied to all the control gate lines $CGL_1$, $CGL_2$, $CGL_3$, ... Meanwhile, only the transistor $Q_{02}$ of the drain line $DL_2$ to which the selected memory device $M_{22}$ is connected is turned on to connect the drain line to the unified drain line DL.

The source lines $SL_1$, $SL_3$, ... are floated. Therefore, no drain current is formed through the memory devices $M_{11}$, $M_{21}$, $M_{31}$, ..., $M_{13}$, $M_{23}$, $M_{33}$, ... connected to the source lines irrespective of whether the elements are to be turned on or off. Meanwhile, the transistors $Q_{01}$, $Q_{03}$, ... of the drain lines $DL_1$, $DL_3$, ... are off. Therefore, no drain current is formed through the memory devices $M_{11}$, $M_{12}$, $M_{13}$, ..., $M_{31}$, $M_{32}$, $M_{33}$, ... connected to the drain lines $DL_1$, $DL_3$, ... irrespective of whether the elements are to be turned on or off (for this reason the current I is made to be I=0 in regard to the elements in FIG. 6). Therefore, according to the contents of data to be written into the memory device $M_{22}$ (according to the direction of polarization of the ferroelectric layer), the established maximum drain current $I_{OMAX}$ (the point X in FIG. 8) or a current of zero (the point Y in FIG. 5) is formed through the unified drain line DL. The above-mentioned two states are discriminated by the reference current $I_S$ (i.e., depending on whether each state is greater or smaller than the reference current $I_S$) to allow the data to be read. In other words, the recorded data can be read in a non-destructive manner.

In a manner as described above, the write and read operations can be effected on the desired memory device.

In the aforementioned preferred embodiment, the reference voltage to be applied to the memory gate MG for the write operation is made equal to the threshold voltage, and the reference voltage to be applied to the memory gate MG for the read operation is made equal to the threshold voltage. Therefore, the influence possibly exerted on the elements other than the selected memory device can be reduced in the write and read operations. Furthermore, by making the voltage in the write mode and the voltage in the read mode equal to each other, peripheral circuits can be simplified.

It is to be noted that the voltage to be applied to the memory gate MG for the write operation may be different from the voltage applied to the memory gate MG for the read operation so long as it is a voltage (intermediate voltage) corresponding to a current within a range of from the established maximum drain current $I_{OMAX}$ to zero.

Figure 1:
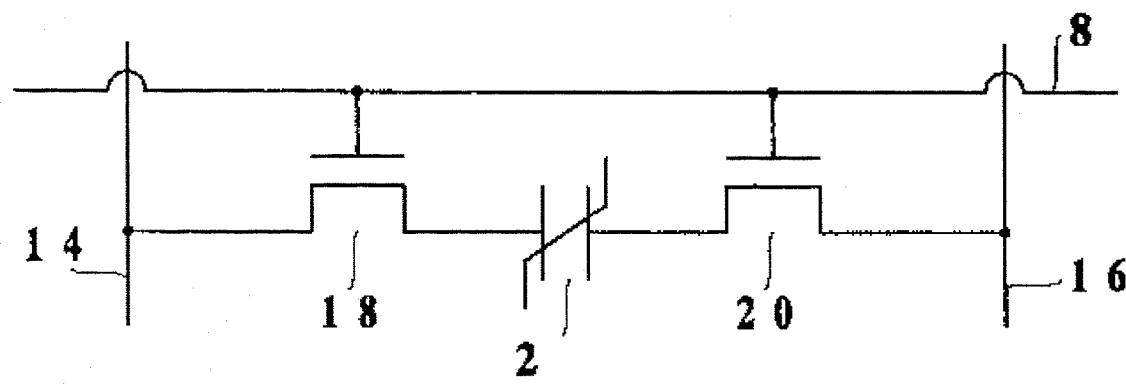
FIG. 1 shows circuitry of non-volatile memory device in the prior art.

In order to operate the circuit shown in FIG. 1, a circuit for generating the reference voltage $V_{ref}$ is necessary. As is apparent from FIG. 5, there is the possibility that an erroneous read or write operation may take place unless a correct reference voltage $V_{ref}$ corresponding to the memory devices constituting the memory is obtained. In the present preferred embodiment, an appropriate reference voltage $V_{ref}$ is obtained by means of a generating circuit 40 for the reference voltage as shown in FIG. 7.

Figure 7:
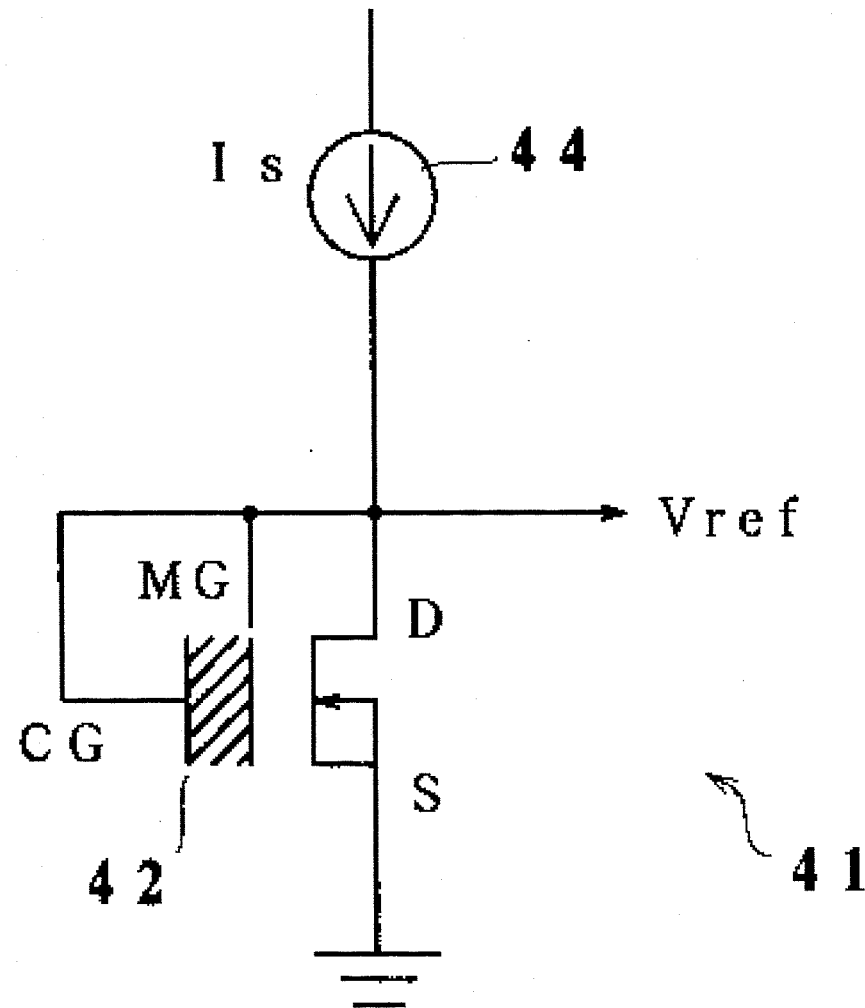
FIG. 7 shows a generation circuit for a reference voltage.

In FIG. 7, a device 42 for generating the reference voltage is the same device as the memory device M which needs the reference voltage. The device 42 is made from the same wafer, in the same process and at the same time as the memory device M. The Control gate electrode CG, the memory gate electrode MG, and the drain electrode D are short-circuited, while the drain electrode D is connected to a constant-current source 44 which produces the reference current $I_S$ (refer to FIG. 5). The element 42 has the characteristic represented by the curve β in FIG. 5 because the control gate electrode CG and the memory gate electrode MG are short-circuited. Meanwhile, since the current $I_S$ is given to the drain, the voltage at the control gate electrode CG is made equal to the reference voltage $V_{ref}$. The element 42 is fabricated in an identical process to have the same structure as that of the memory device M. Therefore, even though the characteristic of the memory device M varies in the manufacturing process or in the operating stage, the characteristic of the element 42 varies in the same manner. Therefore, the reference voltage $V_{ref}$ can be maintained at an appropriate value in regard to a relative relationship between the element 42 and the memory device M.

When an intermediate voltage is required, it is permitted to provide a current source corresponding to the intermediate voltage instead of the current source 44.

In order to operate the circuit shown in FIG. 2, a judgment circuit for the drain current is necessary. In the description based on FIG. 2, there has been described the method of discriminating the data recorded in the selected memory device $M_{22}$ depending on whether the drain current flowing through the drain line DL is greater or smaller than the reference current $I_S$. In more detail, the power voltage $V_{DD}$ is applied to the unified drain line DL via the resistor R so that a drain current $I_D$ smaller than the reference current $I_S$ is formed when the selected memory device $M_{22}$ is polarized in the first state or a drain current $I_D$ greater than the reference current $I_S$ is formed when the selected memory device $M_{22}$ is polarized in the second state. By measuring the current flowing through the unified drain line DL by means of a current measuring circuit, the discrimination can be achieved, however, the circuit construction is complicated.

Figure 8:
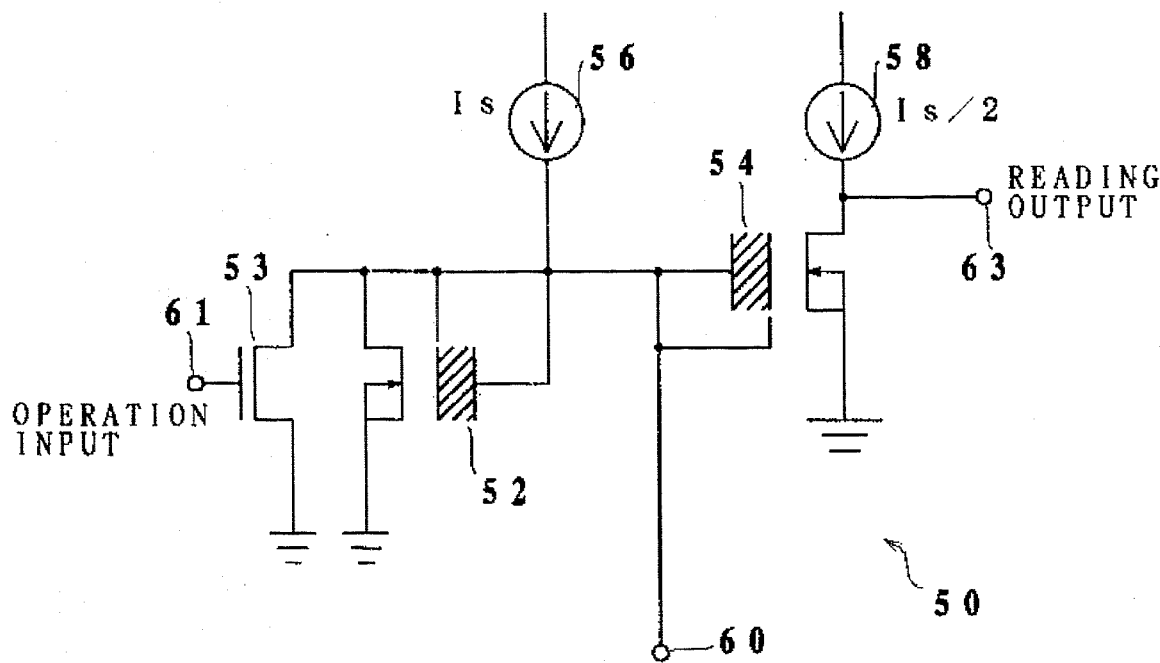
FIG. 8 shows a judgment circuit for a drain current.

In view of the above, a judgment circuit 50 for the drain current as shown in FIG. 8 may be utilized. In the present case, the resistor R is not necessary. A first device 52 for drain current judgment and a second device 54 for drain current judgment are same device as the memory device M. Both of the devices 52 and 54 are made from the same wafer, in the same process and at the same time as the memory device M. A drain electrode D of the element 52 is connected to a constant-current source 56 which produces a current $I_S$ which is about one half of the established maximum drain current $I_{OMAX}$ (a voltage corresponding to the threshold voltage). On the other hand, a drain electrode D of the element 54 is connected to a constant-current source 88 which produces a current which is one half of the current $I_S$. A terminal 60 of the above-mentioned circuit is connected to the unified drain line DL (FIG. 2).

When the selected memory device $M_{22}$ is polarized in the second state and has a capacity for allowing a drain current exceeding the current $I_S$ to flow, the current $I_S$ of the constant-current source 56 flows into the memory device $M_{22}$, however, the current does not flow into the element 52. Consequently, the element 52 is turned off, and also the element 54 is turned off. When the selected memory device $M_{22}$ is polarized in the first state and does not have the capacity for allowing a drain current exceeding the current $I_S$ to flow, the current $I_S$ of the constant-current source 56 does not flow into the memory device $M_{22}$, however, the current flows into the element 52. Consequently, the element 52 is turned on, and also the element 54 is turned on. Therefore, a read output corresponding to the data written in the selected memory device $M_{22}$ can be obtained. In the discrimination circuit 50, the elements 56 and 58 are fabricated in an identical process to have the same structure as that of the memory device M in the same manner as in FIG. 7, there occurs no erroneous operation due to possible characteristic variation.

When an operation input terminal 61 has a low level of "L", a transistor 53 is off, and therefore the circuit operates in the above-mentioned manner. However, when the operation input terminal 61 has a high level of "H", the transistor 53 is turned on to flow the current of the constant-current source 56 through the transistor 53. Consequently, a read output terminal 63 is fixed to the level of "L".

Figure 9:
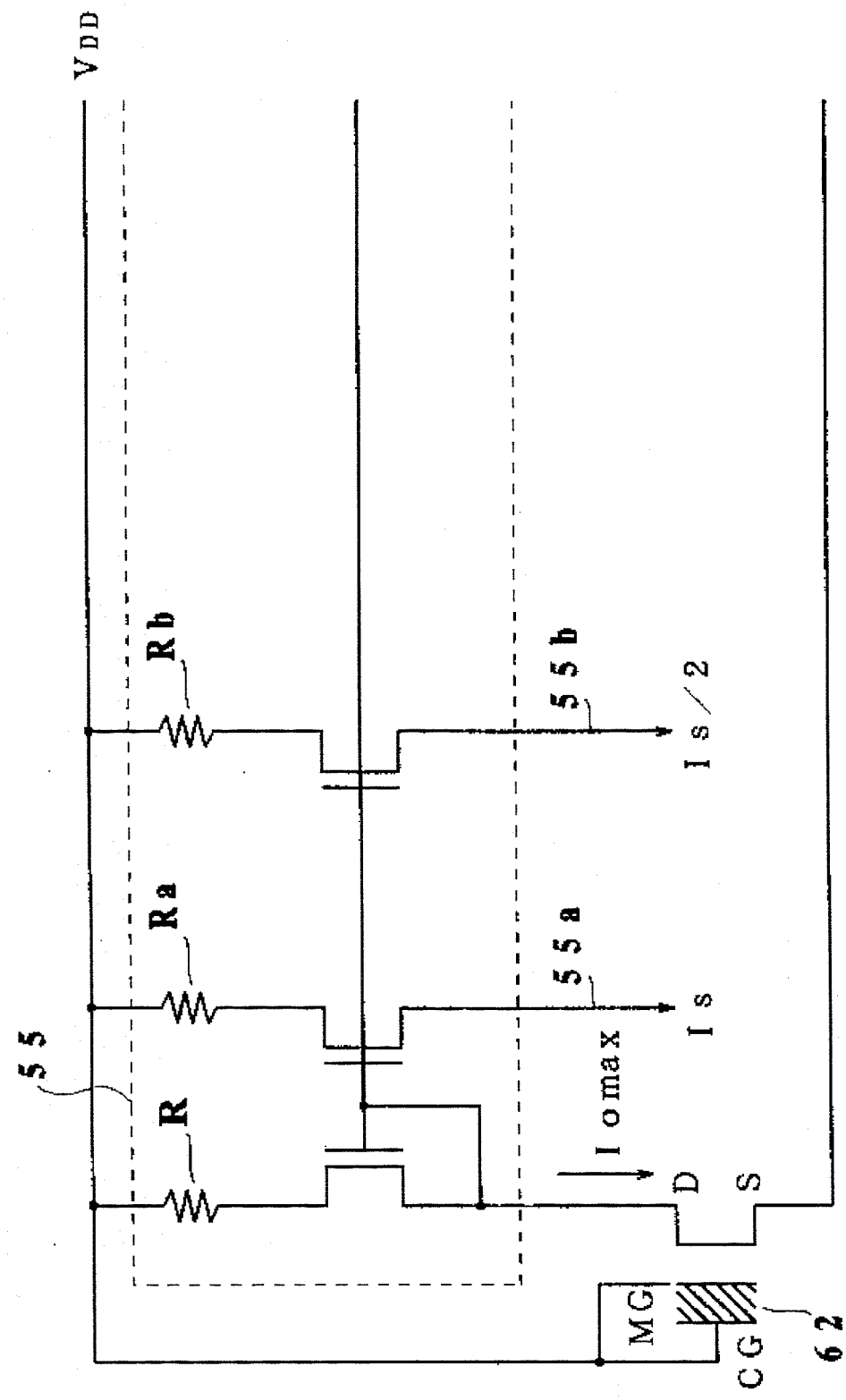
FIG. 9 shows a constant current source.

The constant-current sources shown in FIGS. 7 and 8 can be implemented by a circuit as shown in FIG. 9. A memory gate electrode MG and a control gate electrode CG of an element 62 for current source are short-circuited, and the power voltage $V_{DD}$ is applied to the element. The element 62 is the same device as the memory device M. The device 42 is made from the same wafer, in the same process and at the same time as the memory device M. A drain electrode D of the element is connected to an input side of a current mirror circuit 55. Therefore, the established maximum drain current $I_{OMAX}$ corresponding to the configuration and capacity of the element flows through the drain of the element 62. An output side 55a of the current mirror circuit 55 is connected to a resistor Ra. By selecting the resistance value of the resistor Ra, a current $I_S$ ($I_{OMAX}/2$) can be obtained from the output side 55a. In the same manner as above, an output side 55b is connected to a resistor Rb which can obtain a current of $I_S/2$ ($I_{OMAX}/4$).

Although the desired output current is obtained by changing the resistance value in the aforementioned preferred embodiment, it is acceptable to obtain the desired output current by changing the width of the transistor (transistor width) on the output side to change the characteristic of the transistor. It is also acceptable to obtain the desired output current by changing both of the above-mentioned factors.

Since the established maximum drain current $I_{OMAX}$ is obtained by means of the element 62 which is fabricated in an identical process to have the same structure as that of the memory device M also in the present circuit, the variation error can be canceled.

Figure 10:
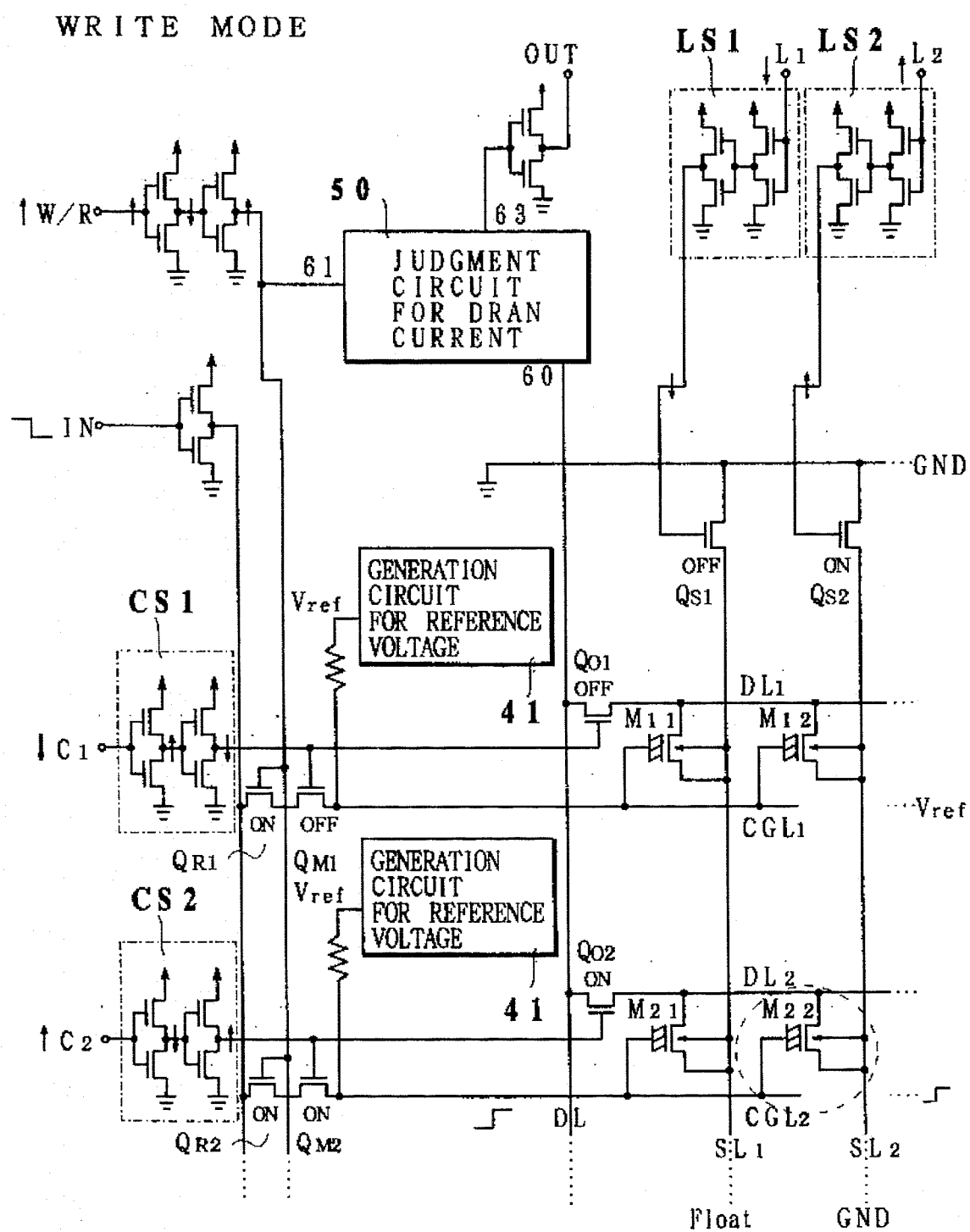
FIG. 10 shows the voltage applied to the non-volatile memory in the write mode of the embodiment of the present invention.

FIG. 10 shows a circuit diagram of a non-volatile memory comprised of the generation circuit 41 for the reference voltage shown in FIG. 7 and the judgment circuit 50 for the drain current shown in FIG. 8, where source lines connect to the source region and channel region of each memory element. Although FIG. 10 shows only a two-by-two matrix portion for simplicity, there are practically arranged n×n memory devices M. FIG. 13 shows application voltage conditions at each terminal in a recording stage It is herein assumed that a write operation is effected on the memory device $M_{22}$. A terminal W/R is made to have the level of "H" in a write mode. With the above-mentioned arrangement, the operation input terminal 61 of the drain current discrimination circuit 50 comes to have the level of "H", and therefore the drain current discrimination circuit 50 performs no read operation (the read output terminal 63 is fixed to the level of "L"). In the present preferred embodiment, the level of "H" is determined to have a voltage of 5 V, and the level of "L"

is determined to have a voltage of 0 V. Meanwhile, the threshold voltage $V_{ref}$ (refer to FIG. 5A) of the memory device is determined to be a voltage of 2.5 V.

Only a terminal $C_2$ of a row to which the selected memory device $M_{22}$ for the write operation belongs is made to have the level of "H", and the terminals $C_1, \ldots$ of the other rows are made to have the level of "L". In response to the above-mentioned operation, a selection means $CS_2$ of the row to which the selected memory device $M_{22}$ belongs among first selection means $CS_1, CS_2, \ldots$ turns on a transistor $Q_{M2}$. The selection means $CS_1$, of the other rows turn off transistors $Q_{M1}, \ldots$ Only a terminal $L_2$ of a column to which the selected memory device $M_{22}$ for the write operation belongs is made to have the level of "H", and the terminals $L_1, \ldots$ of the other columns are made to have the level of "L". In response to the above-mentioned operation, a source switching means $Q_{S2}$ of the column to which the selected memory device $M_{22}$ belongs is turned on, and the source switching means $Q_{S1}, \ldots$ of the other columns are turned off. Therefore, a source line $SL_2$ to which the selected memory device $M_{22}$ belongs is grounded, and the source lines $SL_1$ of the other columns are floated.

In the above-mentioned condition, a desired voltage (data) to be recorded having the level of "H" or "L" is applied from a terminal IN. The above-mentioned voltage is applied to a control gate line $CGL_2$ of the row to which the selected memory device $M_{22}$ belongs via a transistor $Q_{R2}$ (turned on when the terminal W/R has the level of "H") and a transistor $Q_{M2}$ (turned on when the terminal $C_2$ has the level of "H"). Since the terminals $C_1, \ldots$ have the level of "L", the transistors $Q_{M1}, \ldots$ are turned off to apply the reference voltage $V_{ref}$ to control gate lines $CGL_1, \ldots$ of the other rows.

To the source and the substrate (channel) of the memory device $M_{22}$ is applied the ground potential, while a desired voltage to be recorded is applied to the control gate of the element. Therefore, the ferroelectric layer of the memory device $M_{22}$ is polarized according to the voltage to be recorded. The voltage to be recorded is also applied to the control gates of the memory devices $M_{21}, \ldots$ of the same row as that of the memory device $M_{22}$. However, since the sources and the substrates of the memory devices $M_{21}, \ldots$ are floated, the ferroelectric layers of the elements receive no influence of the write voltage. Meanwhile, the ground potential is applied to the sources and the substrates of the memory devices $M_{21}, \ldots$ of the same row as that of the memory device $M_{22}$. However, since the reference voltage $V_{ref}$ is applied to the control gates of the memory devices $M_{12}, \ldots$, the ferroelectric layers of the elements receive no influence of the write voltage.

In the memory devices $M_{11}, \ldots$ of the rows and columns other than those of the selected memory device $M_{22}$, the sources and substrates are floated, and the reference voltage $V_{ref}$ is applied to the control gate. Therefore, the ferroelectric layers of the elements receive no influence of the write voltage.

Thus the write operation can be selectively effected only on the selected memory device $M_{22}$ in a manner as described above.

Figure 11:
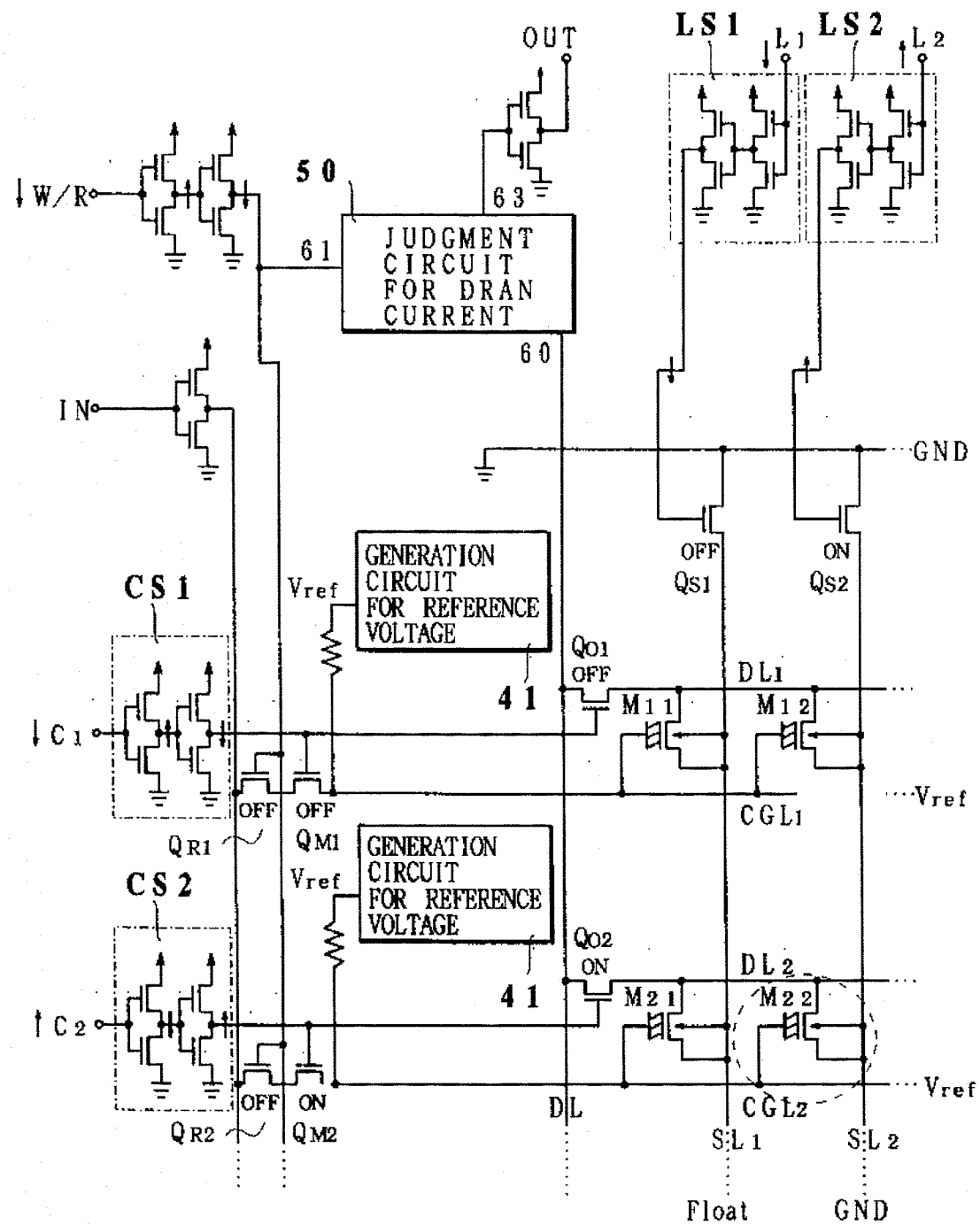
FIG. 11 shows the voltage applied to the non-volatile memory in the read mode of the embodiment of the present invention.

FIG. 11 shows an operational condition for the read mode. It is to be herein noted that a read operation is effected on the memory device $M_{22}$ which is selected as the objective element. As shown in FIG. 13, an L-level potential is applied to the terminal W/R, an L-level potential is applied to the terminal $C_1$, and an H-level potential is applied to the terminal $C_2$. Meanwhile, an L-level potential is applied to a terminal $L_1$, and an H-level potential is applied to a terminal $L_2$. A read output is obtained at a terminal OUT.

The terminal W/R is made to have the level of "H" in the read operational. Consequently, the operation input terminal 61 of the drain current discrimination circuit 50 is made to have the level of "L" to make the drain current discrimination circuit 50 perform the read operation. In other words, the recorded data is discriminated based on the drain current, and outputted from the terminal OUT. By making the terminal W/R have the level of "L", the transistors $Q_{R1}, Q_{R2}, \ldots$ are turned off to prevent the voltage at the terminal IN from exerting influence on the control gate line.

The arrangement that only the terminal $C_2$ of the row and the terminal $L_2$ of the column to which the selected memory device $M_{22}$ for the read operation belongs are made to have the level of "H" is the same as that in the write mode. Therefore, the transistor $Q_{02}$ which serves as a drain switching means of the drain line $DL_2$ to which the memory device $M_{22}$ belongs is turned on, while the transistor $Q_{01}$ of another drain line $DL_1$ is turned off. Meanwhile, the source line $SL_2$ of the column to which the selected memory device $M_{22}$ belongs is grounded, and the source lines $SL_1, \ldots$ are floated. Meanwhile, the reference voltage $V_{ref}$ is applied to the control gate lines $CGL_1, \ldots$ of all the memory devices including the control gate line $CGL_2$ to which the selected memory device $M_{22}$ belongs.

The source and the substrate of the memory device $M_{22}$ are grounded, while the reference voltage $V_{ref}$ is applied to the control gate. Therefore, when the ferroelectric substance of the memory device $M_{22}$ is polarized in the second state, a channel corresponding to the current at the point X shown in FIG. 5A is formed. When the ferroelectric substance is polarized in the first state, no channel is formed (the point Y). Further, since the source of the memory device $M_{22}$ is grounded, the memory device $M_{22}$ has a capacity of flowing a current corresponding to the formed channel.

In the memory devices $M_{21}, \ldots$ of the same row as that of the memory device $M_{22}$, the sources and the substrates are floated. Therefore, the memory devices are not allowed to have the capacity of flowing the current. Meanwhile, the ground potential is applied to the sources and the substrates of the memory devices $M_{12}, \ldots$ of the same column as that of the memory device $M_{22}$. However, since the transistor $Q_{01}$ is off, the memory devices are not allowed to have the capacity of flowing the current. In the memory devices $M_{11}, \ldots$ of the rows and columns other than those of the memory device $M_{22}$, the sources are floated. Therefore, no channel is formed, and the memory devices are not allowed to have the capacity of flowing the current.

Therefore, the drain line $DL_2$ of the row to which the memory device $M_{22}$ belongs has the capacity of flowing the current corresponding to the storage contents. To the unified drain line DL is connected only the drain line $DL_2$. Therefore, the established maximum drain current $I_{OMAX}$ (the point X in FIG. 5) or a current of zero (the point Y in FIG. 5) flows through the unified drain line DL according to the storage contents of the memory device $M_{22}$ (according to the direction of polarization of the ferroelectric layer). The unified drain line DL is connected to a discrimination input terminal 60 of the drain current discrimination circuit 50. Therefore, a read output is obtained from the output terminal OUT according to the storage contents of the memory device $M_{22}$.

Figure 12:
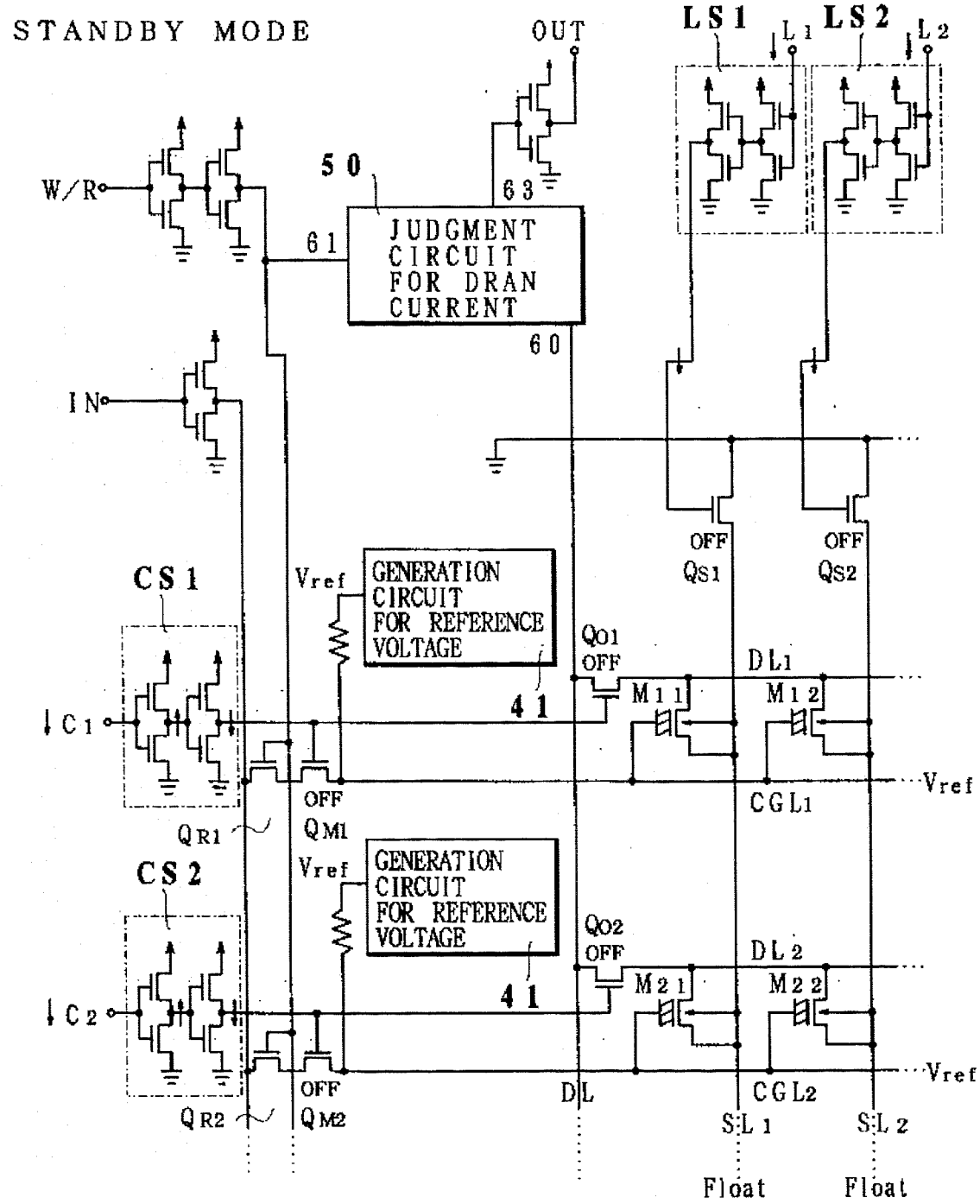
FIG. 12 shows the voltage applied to the non-volatile memory in the standby mode of the embodiment of the present invention.

FIG. 12 shows an operational condition in a standby mode. The present preferred embodiment is arranged so that it is automatically put into the standby mode by making all the terminals $C_1, C_2, \ldots, L_1, L_2, \ldots$ for selecting the objective element have the level of "L" (by effecting no address selecting operation). In all the memory devices $M_{11}, M_{12}, \ldots, M_{21}, M_{22}, \ldots$, the reference voltage is applied to the control gates, while the sources and the substrates are floated to prevent the storage contents from being altered.

Figure 14:
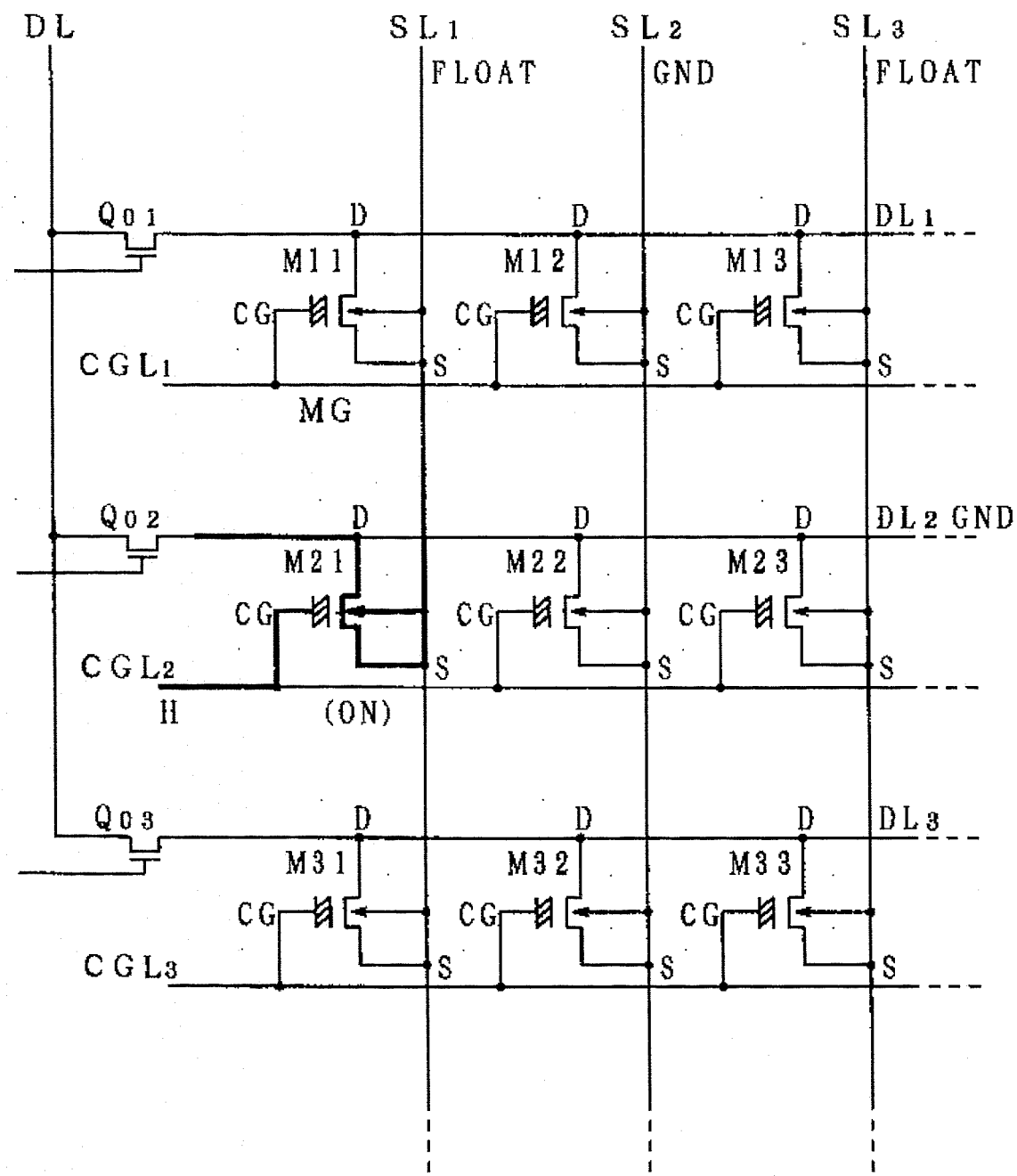
FIG. 14 shows the applied voltage path in the write operational mode.

In the circuit as shown in FIGS. 2 and 10, there is the possibility that an erroneous operation as follows may occur depending on the characteristic of the ferroelectric substance and a selection of the bias. FIG. 14 shows a condition in which the write operation is effected by giving the level of "H" to the control gate of the non-volatile memory device $M_{22}$. In effecting the write operation on the selected memory device $M_{22}$, the ground potential is applied to the source line $SL_2$, and the other source lines $SL_1, SL_3, \ldots$ are floated. Since the memory device $M_{22}$ is turned on in the write operation into the memory device $M_{22}$, the drain line $DL_2$ is made to have the ground potential.

In the above-mentioned case, there exists a memory device which is turned on depending on the storage condition among the memory devices $M_{21}, M_{23}, \ldots$ arranged in the same row as that of the memory device $M_{22}$. It is now assumed that the memory device $M_{21}$ is turned on. Then there is achieved an electric conduction between the drain and the source of the memory device $M_{21}$ to make the source have the ground potential. Meanwhile, due to the voltage applied to the control gate line $CGL_2$ for the write operation, the H-level voltage is applied to the control gate of the memory device $M_{21}$. Therefore, it is possible that an erroneous write operation is effected on the memory device $M_{21}$.

Figure 15:
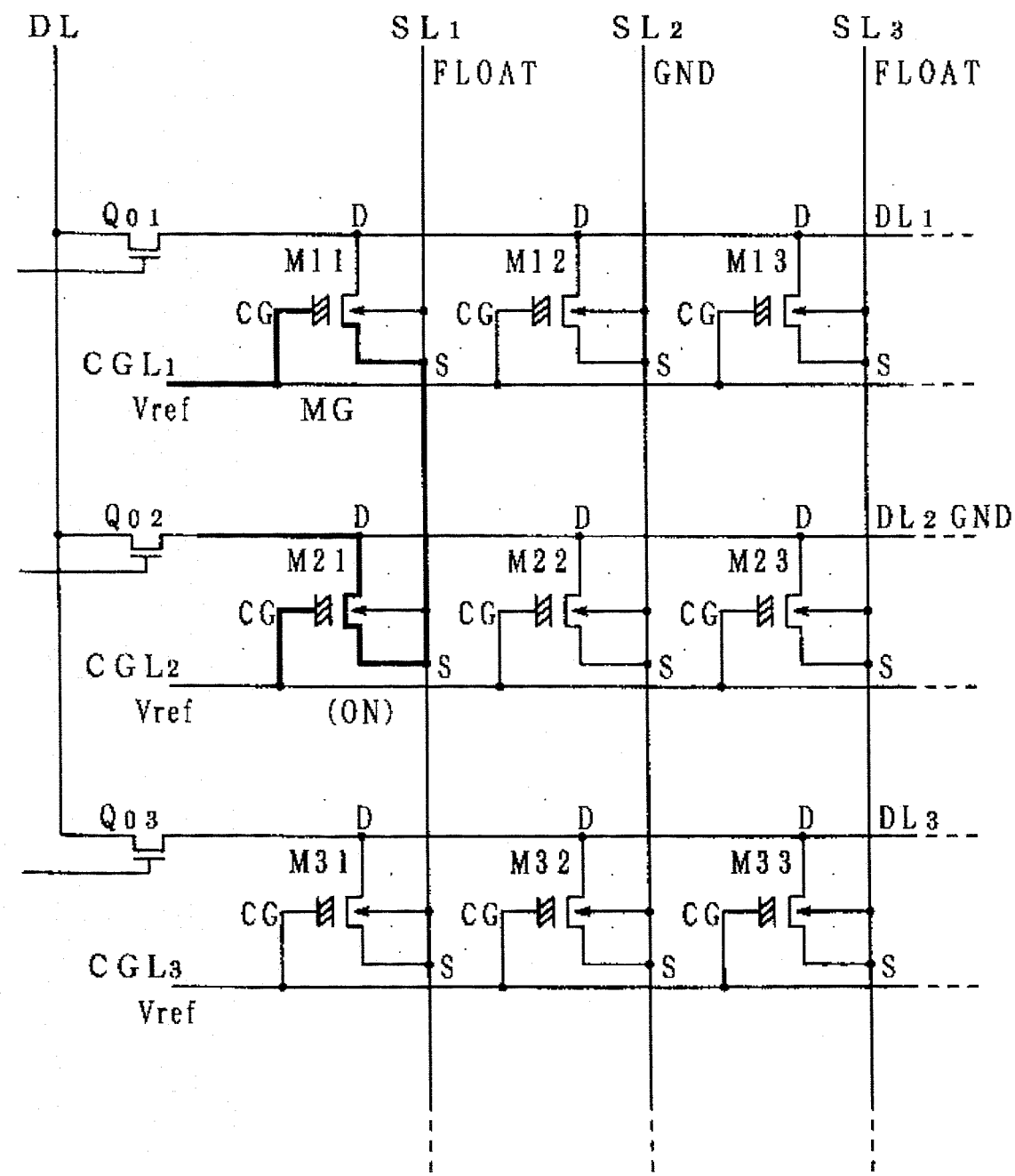
FIG. 15 shows the applied voltage path in the read operational mode.

FIG. 15 shows a condition in which the read operation is effected on the memory device $M_{22}$. In order to read the storage contents of the memory device $M_{22}$, the control gate line $CGL_2$ is made to have the reference voltage $V_{ref}$. Meanwhile, the source line $SL_2$ is made to have the ground potential, and the other source lines $SL_1, SL_3, \ldots$ are floated. When the memory device $M_{22}$ is in such a storage condition that it is turned on, the drain line $DL_2$ is made to have the ground potential.

In the above-mentioned stage, the reference voltage $V_{ref}$ is also applied to the memory devices $M_{21}, M_{23}, \ldots$ of the same row. Therefore, depending on the storage condition, the memory devices $M_{21}, M_{23}, \ldots$ are turned on. For instance, when the memory device $M_{21}$ is turned on, the ground potential at the drain of the memory device $M_{21}$ is transferred by way of the source of the memory device $M_{21}$, the source line $SL_1$, and the source of the memory device $M_{11}$. Meanwhile, the reference voltage $V_{ref}$ is applied to the control gate of the memory device $M_{11}$. Therefore, it is possible that an erroneous write operation is effected on the memory device $M_{11}$.

Figure 16:
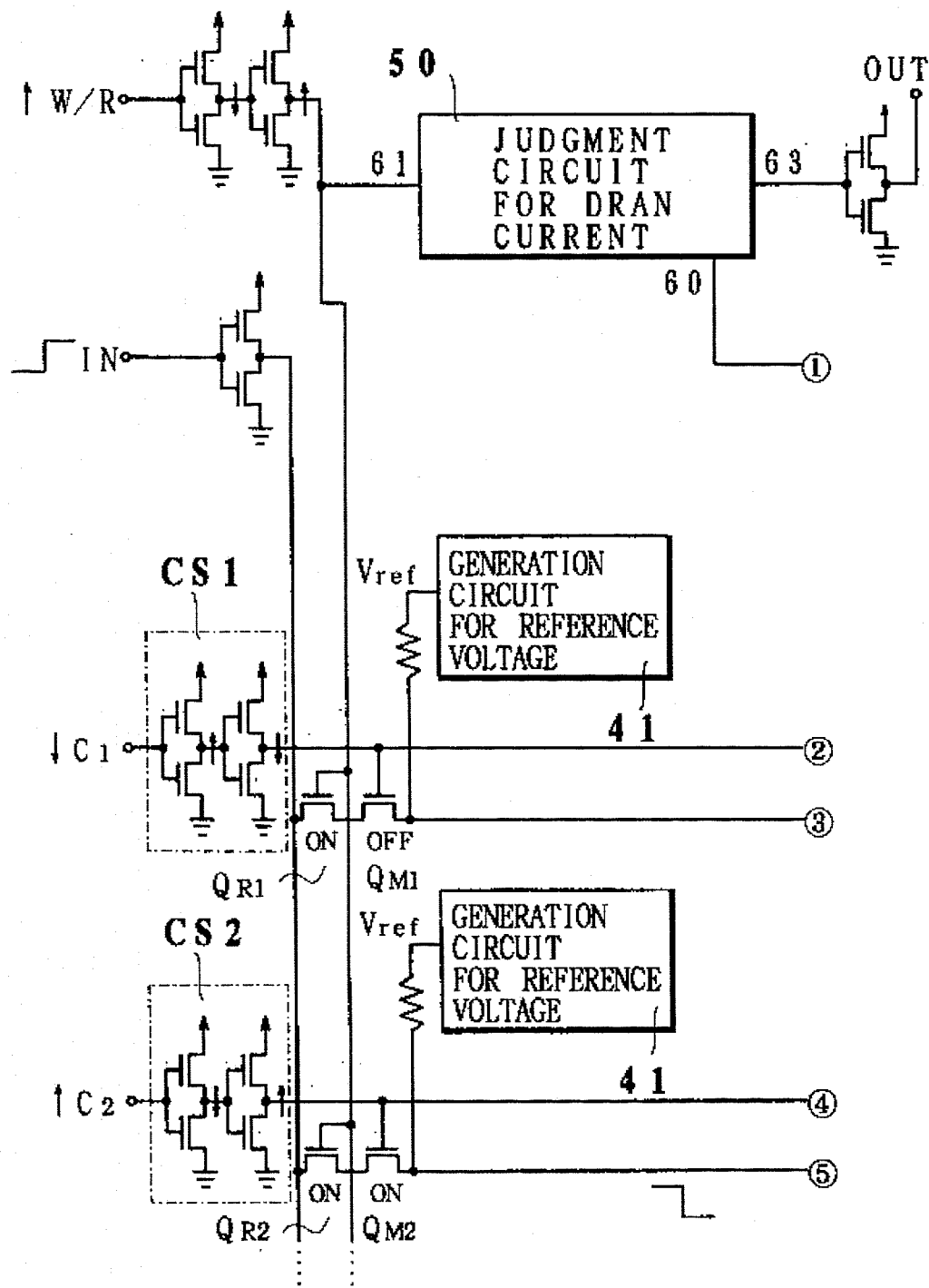
FIGS. 16 and 17 show the voltage applied in the write mode of a non-volatile memory having protection switching means for control gate and for drain.
Figure 17:
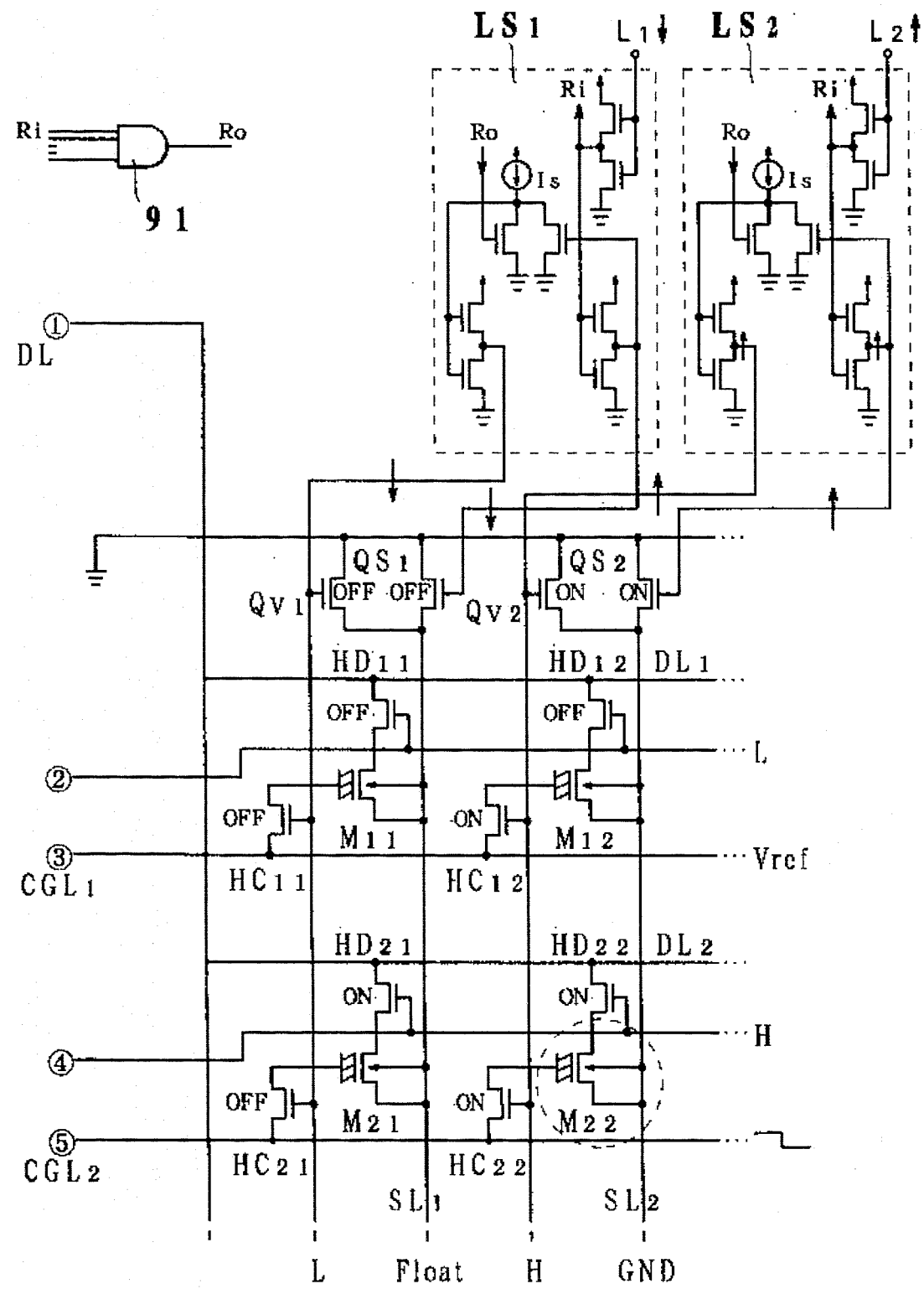

FIGS. 16 and 17 show a circuit which solves the above-mentioned problems. In the present preferred embodiment, the control gates of the memory devices are provided with control gate protection transistors $HC_{11}, HC_{12}, \ldots HC_{21}, HC_{22}, \ldots$ which are control gate protection switching means. Memory devices of an identical row are connected to an identical control gate line via the control gate protection transistors. The control gate protection transistors $HC_{11}, HC_{21}, \ldots$ are turned on when the level of "H" is given to the selection terminal $L_1$, while the control gate protection transistors $HC_{12}, HC_{22}, \ldots$ are turned on when the level of "H" is given to the selection terminal $L_2$. In other words, the control gate protection transistors of the columns other than the column to which the selected memory device belongs are designed to be turned off.

Furthermore, the drains of the memory devices are provided with drain protection transistors $HD_{11}, HD_{12}, \ldots HD_{21}, HD_{22}, \ldots$ which are drain protection switching means. Memory devices of an identical row are connected to an identical drain line via the drain protection transistors. The drain protection transistors $HD_{11}, HD_{12}, \ldots$ are turned on when the level of "H" is given to the selection terminal $C_1$, while the drain protection transistors $HC_{21}, HC_{22}, \ldots$ are turned on when the level of "M" is given to the selection terminal $C_2$. In other words, the drain protection transistors of the rows other than the row to which the selected memory device belongs are designed to be turned off.

FIGS. 16 and 17 show an operation condition in a write mode. A description below will be made based on the assumption that the memory device $M_{22}$ is the selected memory device for the write operation. In the present case, only the terminal $C_2$ is made to have the level of "H", while the other terminals $C_1, \ldots$ are made to have the level of "L". Meanwhile, only the terminal $L_2$ is made to have the level of "H", and the other terminals $L_1, \ldots$ are made to have the level of "L". With the above-mentioned arrangement, the protection transistors $HC_{12}, HC_{22}, \ldots$ are turned on, and a voltage required for the write operation is applied to the selected memory device $M_{22}$ via the control gate line $CGL_2$. Meanwhile, since the protection transistors $HC_{11}, HC_{21}, \ldots$ are off, the control gates of the memory devices $M_{11}, M_{21}, \ldots$ are disconnected from the control gate line $CGL_1$. Therefore, no such path as those shown in FIGS. 13 and 15 is formed, thereby preventing an erroneous write operation and an erroneous erasing operation from occurring.

Furthermore, only the terminal $C_2$ is made to have the level of "H", and the other terminals $C_1, \ldots$ are made to have the level of "L". Therefore, the protection transistors $HC_{21}, HC_{22}, \ldots$ are turned on, and the selected memory device $M_{22}$ is connected to the unified drain line DL. Meanwhile, since the protection transistors $HC_{11}, HC_{12}, \ldots$ are off, the drains of the memory devices $M_{11}, M_{12}, \ldots$ are disconnected from the drain line $DL_1$. Therefore, no such path as those shown in FIGS. 14 and 15 is formed, thereby preventing an erroneous write operation and an erroneous erasing operation from occurring.

Figure 18:
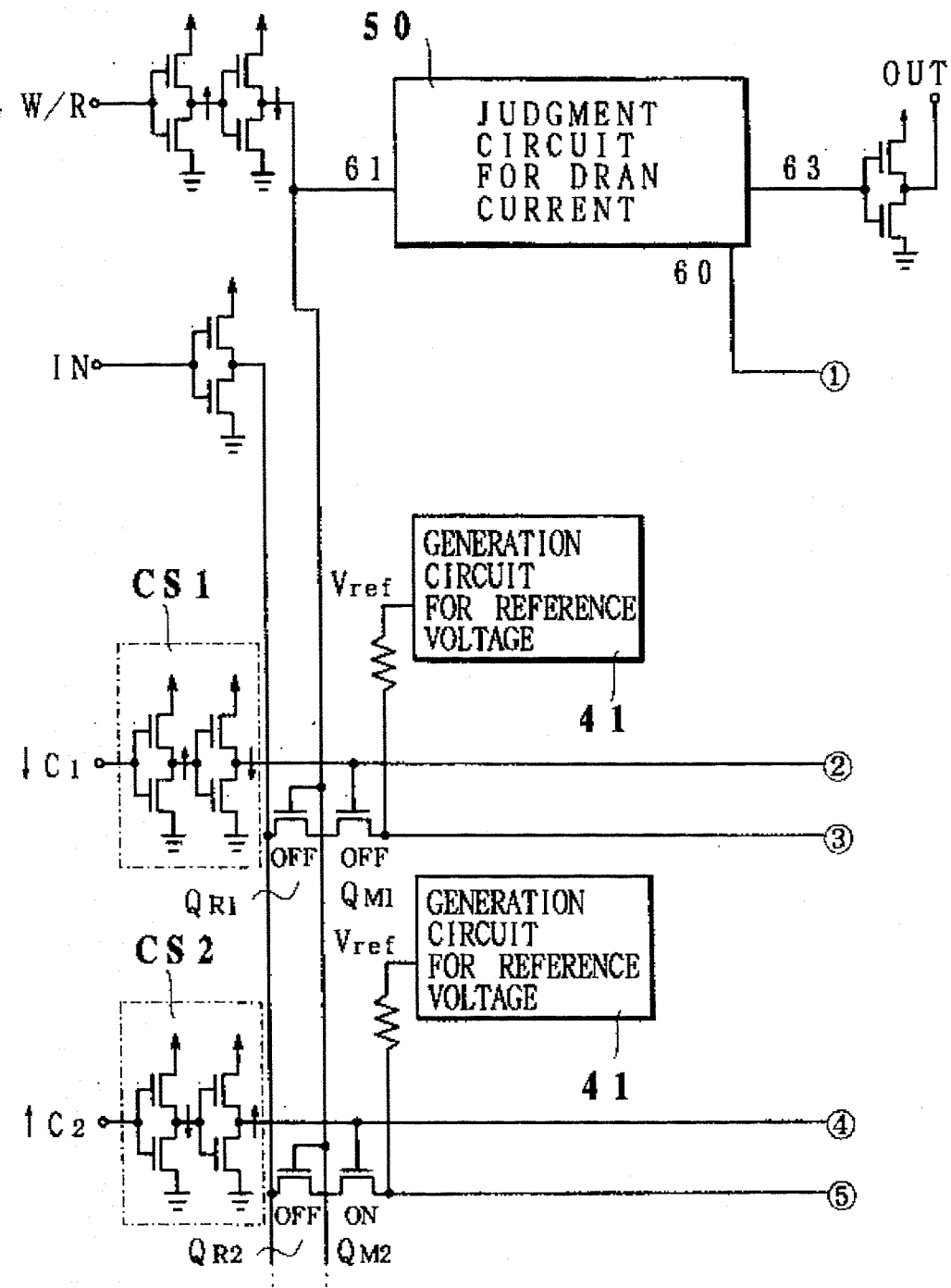
FIGS. 18 and 19 show the voltage applied in the read mode of a non-volatile memory having protection switching means for control gate and for drain.
Figure 19:
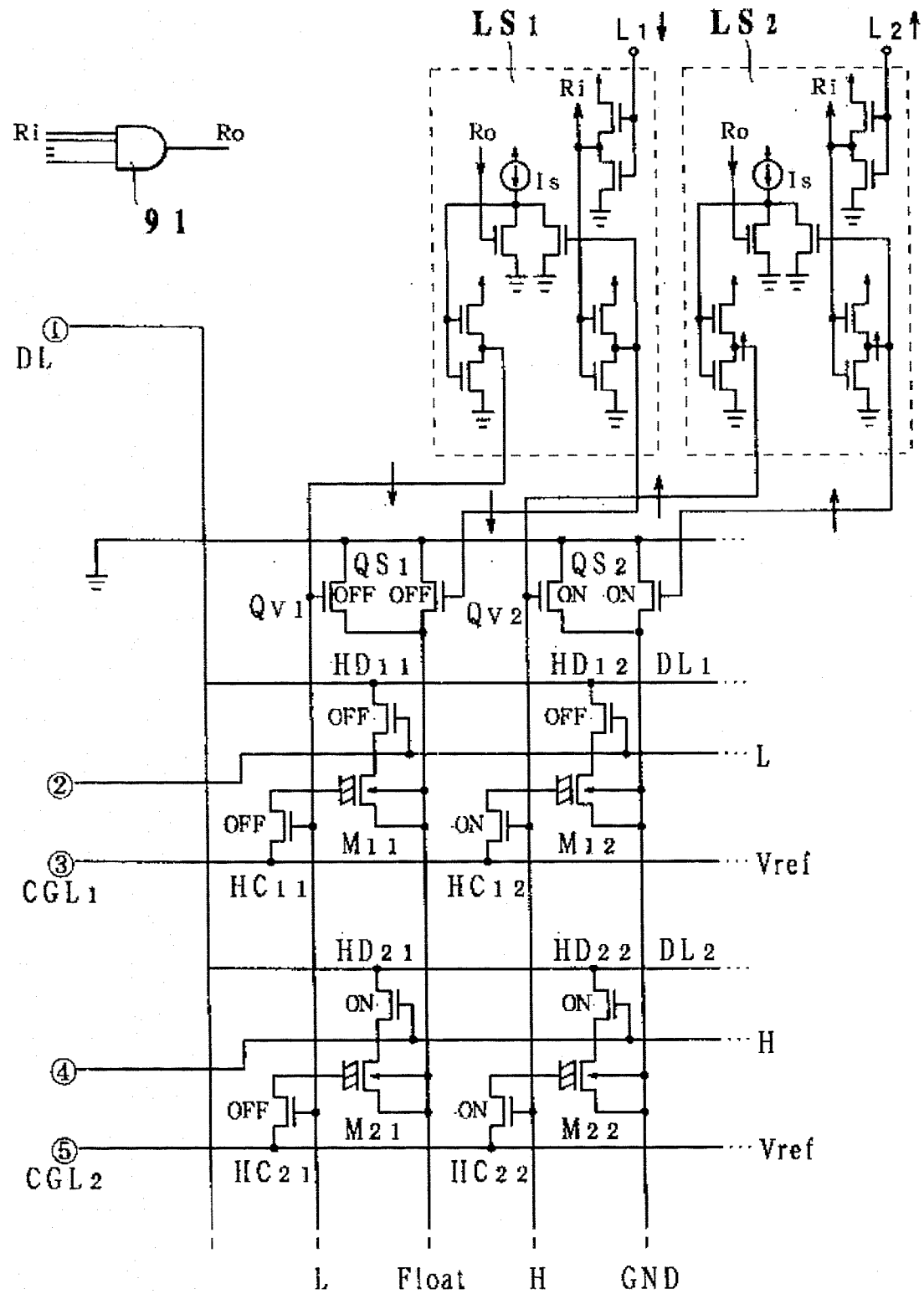

FIGS. 18 and 19 show an operational condition in a read mode when the memory device $M_{22}$ is selected as the selected memory device for the read operation. Also in the read operation, the protection transistors $HC_{11}, HC_{21}, \ldots$ of the columns other than the column to which the selected memory device $M_{22}$ belongs are turned off. Meanwhile, the protection transistors $HD_{11}, HD_{12}, \ldots$ of the row other than the row to which the selected memory device $M_{22}$ belongs are turned off. Therefore, no such path as those indicated by thick lines in FIGS. 14 and 15 is formed, thereby preventing an erroneous write operation and an erroneous erasing operation from occurring.

Figure 20:
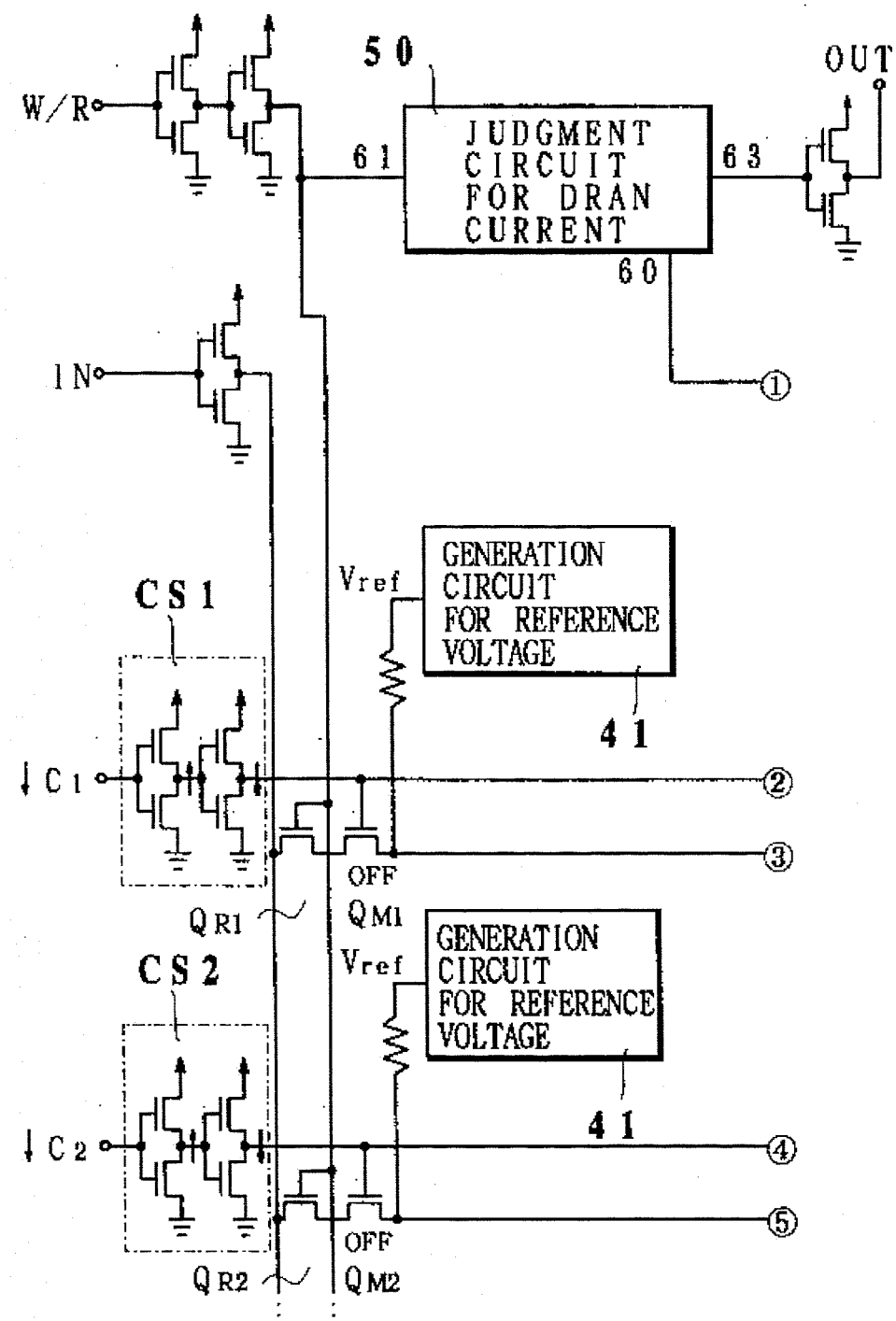
FIGS. 20 and 21 show applied the voltage in the standby mode of a non-volatile memory having protection switching means for control gate and for drain.
Figure 21:
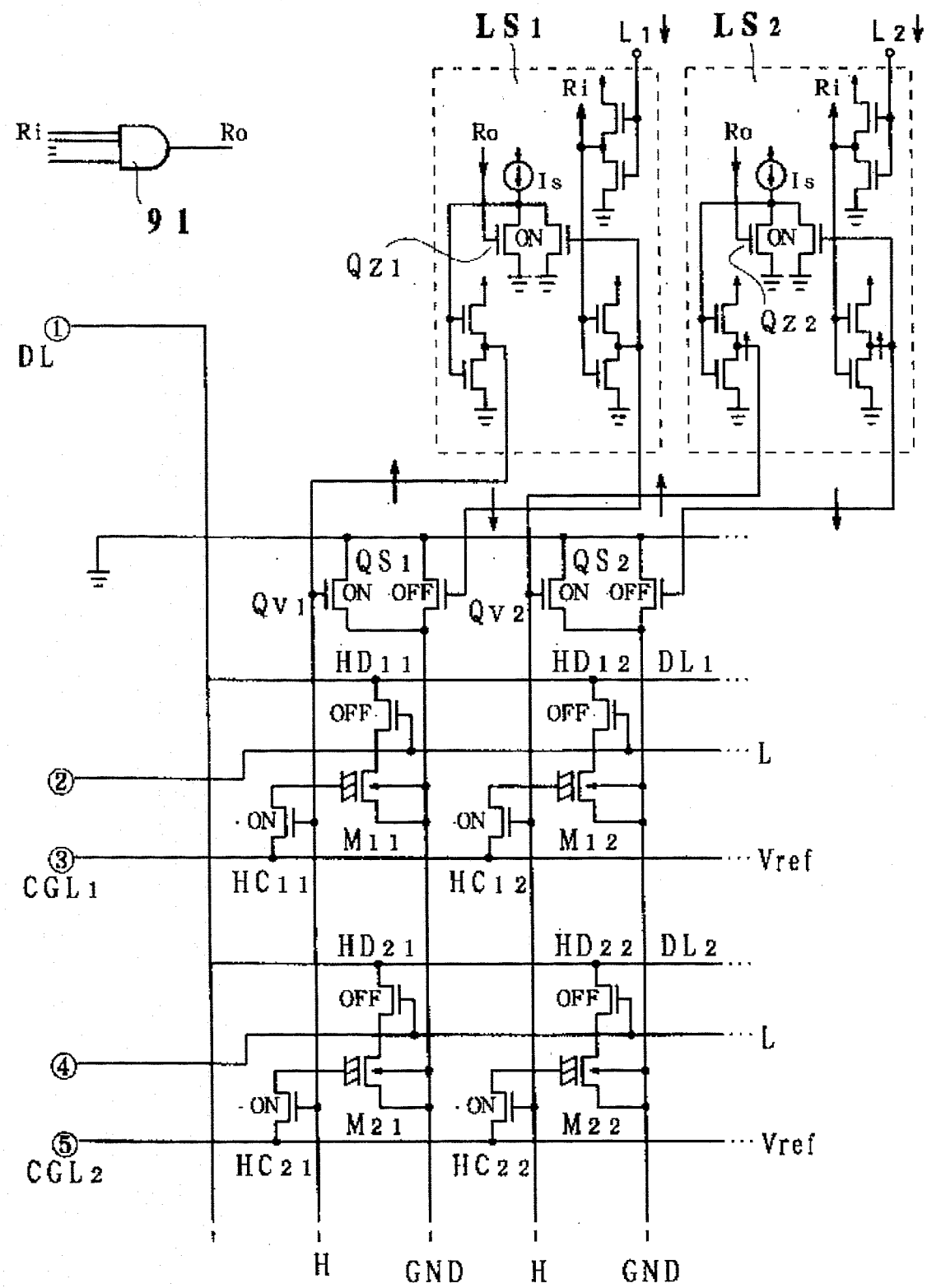

FIGS. 20 and 21 show an operation condition in a standby mode. In the standby mode, the terminals $C_1, C_2, \ldots, L_1, L_2, \ldots$ are all made to have the level of "L". An inversion output Ri of the voltages at the terminals $L_1, L_2, \ldots$ are given to an AND-circuit 91 which is a standby discrimination circuit. Consequently, a decision output Ro having the level of "H" can be obtained from the standby discrimination circuit 91. With the above-mentioned operation, transistors $Q_{Z1}, Q_{Z2}, \ldots$ are turned on, and all the control gate protection transistors $HC_{11}, HC_{12}, \ldots HC_{21}, HC_{22}, \ldots$ are turned on. Meanwhile, transistors $Q_{V1}, Q_{V2}, \ldots$ are all turned on, and all the source lines $SL_1, SL_2, \ldots$ are made to have the ground potential. Consequently, the reference voltage $V_{ref}$ is applied to the control gate of each memory device, and no external voltage is applied to the ends of the ferroelectric layer. Therefore, the storage contents of all the memory devices can be prevented from being altered in the standby mode.

Furthermore, since the terminals $C_1$, $C_2$, . . . are made to have the level of "L", all the drain protection transistors $HD_{11}$, $HD_{12}$, . . . $HD_{21}$, $HD_{22}$, . . . are turned off. Consequently, the drain of each memory device is disconnected from the drain line. Therefore, the storage contents of all the memory devices can be prevented from being altered in the standby mode.

Figure 22:
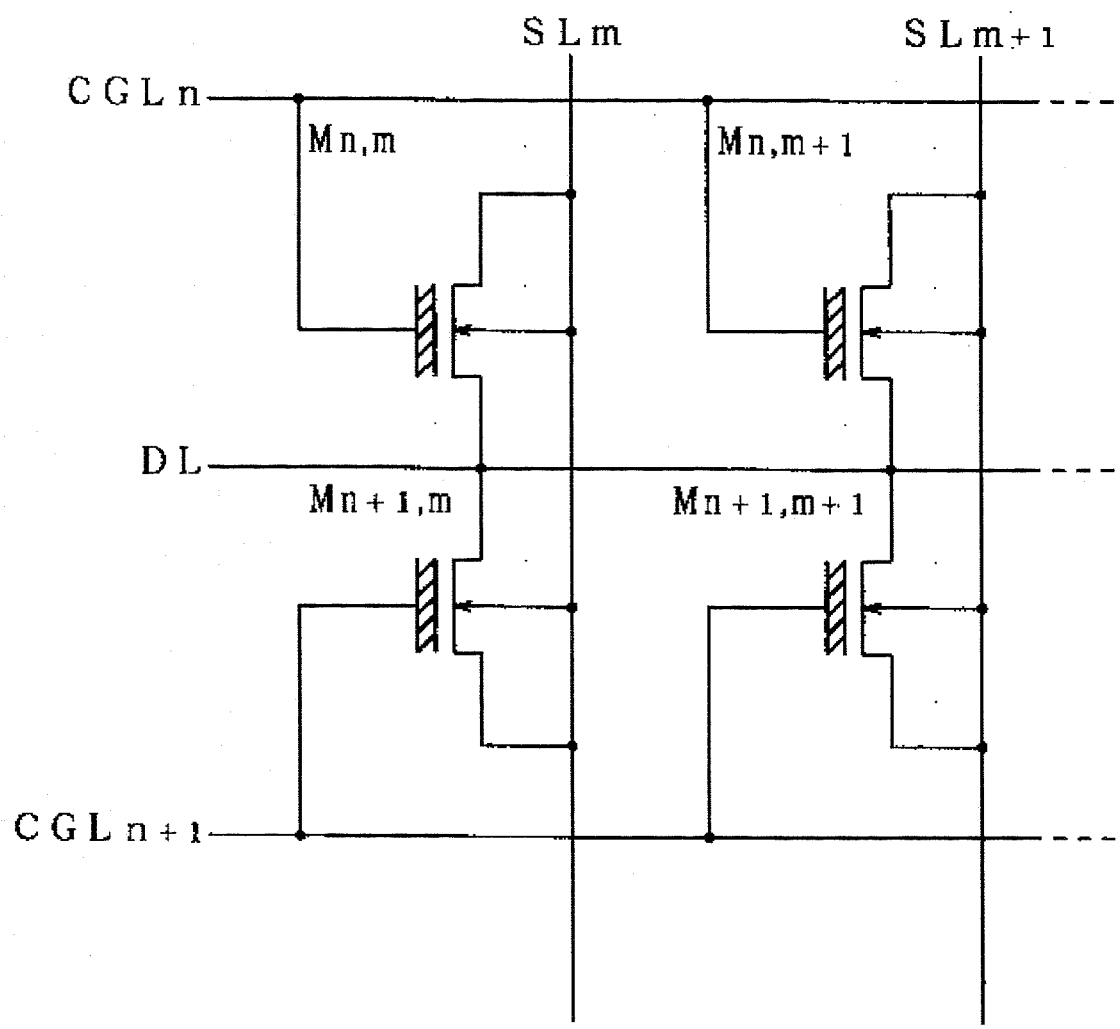
FIG. 22 shows another matrix structure of a memory.

It is acceptable to constitute a matrix having a pair cell structure as shown in FIG. 22 instead of the matrix arrangement of each of the aforementioned preferred embodiments.

Each of the aforementioned embodiments can perform the write and read operations by floating the memory gate MG, and therefore the line for driving the memory gate MG is not necessary, thereby allowing the construction to be simplified.

Although there is a switching operation for determining whether or not the source line is to be grounded by the source switching means in each of the aforementioned preferred embodiments, it is acceptable to perform a switching operation for determining whether or not the reference voltage is to be applied.

According to the non-volatile memory of the present invention, the control gates of non-volatile memory devices of an identical row are connected by means of the control gate lines, and the source regions and the channel regions of the non-volatile memory devices of an identical column are connected by means of the source lines. With the above-mentioned arrangement, the write and read operations on the desired element can be achieved by selecting the voltages to be applied to the control gate line of each row and to the source line of each column.

The non-volatile memory of the present invention has the feature that the drain switching means provided for the drain line to which the objective non-volatile memory device is connected is turned on, and the other drain switching means are turned off. With the above-mentioned arrangement, the influence of the currents on the drain lines other than the objective drain line can be eliminated in the read operation.

In the non-volatile memory of the present invention, each drain line is provided with the drain switching means, and each source line is provided with the source switching means. With the above-mentioned arrangement, the write operation and the read operation can be achieved by controlling the switching means to select the objective element.

In the non-volatile memory of the present invention, each row is provided with the first selection means, and each column is provided with the second selection means. With the above-mentioned arrangement, the write operation and the read operation can be achieved by giving a selection input to the selection means corresponding to the row and the column to which the objective element belongs to select the objective element.

In the non-volatile memory of the present invention, each control gate line is connected to a reference voltage-generating circuit for supplying the reference voltage substantially equal to the threshold voltage of each non-volatile memory device. With the above-mentioned arrangement, there is no such possibility that the storage contents of each element are altered even when the source line is grounded.

In the non-volatile memory of the present invention, when the selection input is given to no row, all the source switching means are turned on to apply the ground potential. With the above-mentioned arrangement, there is no such possibility that the storage contents are altered due to any unexpected voltage applied across both the ends of the ferroelectric layer when neither the write operation nor the read operation is performed.

The non-volatile memory of the present invention has the feature that the control gates of the non-volatile memory devices arranged in an identical row of each column are connected to the control gate line via the control gate protection switching means. With the above-mentioned arrangement, the possible wraparound of a voltage to the elements other than the objective element can be prevented by turning off the control gate protection switching means of the columns other than the column to which the objective element belongs. In other words, the possible erroneous write operation and erroneous erasing operation on the elements other than the objective element can be prevented.

The non-volatile memory of the present invention has the feature that the drain regions of the non-volatile memory devices arranged in an identical row of each column are connected to the drain line via the drain protection switching means. With the above-mentioned arrangement, the possible wraparound of a voltage to the elements other than the objective element can be prevented by turning off the drain protection switching means of the rows other than the row to which the objective element belongs. In other words, the possible erroneous write operation and erroneous erase operation on the elements other than the objective element can be prevented.

The write method and the operation method according to the present invention are achieved by grounding the source of only the objective element and applying the voltage having the level of "H" or "L" to the control gate line. With the above-mentioned arrangement, the write operation can be effected only on the objective element without exerting influence on the elements which are not selected as the objective element for the operation.

The read method and the operation method according to the present invention are achieved by grounding the source of only the objective element and applying the reference voltage to the control gate line. With the above-mentioned arrangement, the read operation can be effected only on the objective element without exerting influence on the elements which are not selected as the objective element for the operation.

The standby method and the operation method according to the present invention have the feature that the reference voltage substantially equal to the threshold voltage of each non-volatile memory device is applied to all the control gate lines, and the ground potential is applied to all the source lines. With the above-mentioned arrangement, there is no such possibility that the storage contents of each element are altered in the standby mode.

Although the present invention has been described as above based on the preferred embodiments thereof, it is to be noted here that the terms have been used not for the purpose of imposing any limitation but for the sake of explanation. Therefore, the terms may subject to change within the scope of the appended claims without departing from the scope and spirit of the present invention.

What is claimed is:

1. A nonvolatile memory formed by a plurality of nonvolatile memory devices connected in a matrix, each of said nonvolatile memory devices comprising:

a source region of a first conductive type and a drain region of the first conductive type, a channel region of a second conductive type formed between the source and drain regions, a memory gate formed on the channel region and insulated from the channel region, a ferroelectric layer formed on the memory gate, and a control gate formed on the ferroelectric layer; wherein said nonvolatile memory comprises:

a drain line connecting the drain regions of each of the plurality of nonvolatile memory devices in a same row of the matrix, a unified drain line connected to each of the drain lines, a control gate line connecting the control gates of each of the plurality of nonvolatile memory devices in a same row of the matrix, a source line connecting the source regions and channel regions of each of the plurality of nonvolatile memory devices in a same column of the matrix, drain switching means for connecting the drain line to, and disconnecting the drain line from, a current judgment means for drain current through the unified drain line, a drain switching means being provided for each drain line; and wherein the drain switching means in the drain line connected to a selected nonvolatile memory device turns on and other drain switching means turn off.

2. The nonvolatile memory in accordance with claim 1 further comprising:

source switching means for connecting the source line to and disconnecting the source line from a ground level, said source switching means being provided for each source line, and control gate switching means for selecting a control gate line depending on whether a voltage of H level or L level is impressed to the control gate line, said control gate switching means being provided for each control gate line.

3. The nonvolatile memory in accordance with claim 2, further comprising:

a first selecting means for controlling the drain switching means by receiving a first selecting input, said first selecting means using the first selecting input for at least one condition of controlling the control gate switching means, and said first selecting means being provided for each row of the matrix, and a second selecting means for controlling the source switching means by receiving a second selecting input, said second selecting means being provided for each column of the matrix.

4. The nonvolatile memory in accordance with claim 2, wherein a generation circuit for a reference voltage is connected to each control gate line, said reference voltage being substantially the same as a threshold voltage of said nonvolatile memory device.

5. The nonvolatile memory in accordance with claim 2, wherein when no selecting input is applied to any column, a reference voltage is applied to all of the control gates by turning off all of the control gate switching means and ground voltage is applied to all of the source regions by turning on all of the source switching means.

6. The nonvolatile memory device in accordance with claim 1, wherein the control gates of the nonvolatile memory devices in same rows of the matrix are connected to the control gate line through control gate protection switching means.

7. The nonvolatile memory in accordance with claim 6, wherein read or write operations are carried out by turning on the control gate protection switching means in the column of a selected nonvolatile memory device and turning off other control gate protection switching means.

8. The nonvolatile memory in accordance with claim 1, wherein the drain regions of the nonvolatile memory devices in same rows of the matrix are connected to the drain line through drain protection switching means.

9. The nonvolatile memory in accordance with claim 8, wherein read or write operations are carried out by turning on the drain protection switching means in the row of a selected nonvolatile memory device and turning off other drain protection switching means.

10. The nonvolatile memory in accordance with claim 1 further comprising:

source switching means for connecting the source line to and disconnecting the source line from a reference voltage, said source switching means being provided for each source line, and control gate switching means for selecting a control gate line depending on whether a voltage of H level or L level is impressed to the control gate line, said control gate switching means being provided for each control gate line.

11. The nonvolatile memory in accordance with claim 10, further comprising a first selecting means for controlling the drain switching means by receiving a first selecting input, said first selecting means using the first selecting input for at least one condition of controlling the control gate switching means, and said first selecting means being provided for each row of the matrix, and second selecting means for controlling the source switching means by receiving a second selecting input, said second selecting means being provided for each column of the matrix.

12. The nonvolatile memory in accordance with claims 10 or 11, wherein a generation circuit for a reference voltage is connected to each control gate line, said reference voltage being substantially the same as a threshold voltage of said nonvolatile memory device.

13. The nonvolatile memory in accordance with claim 10, wherein when no second selecting input is applied to any column, a reference voltage is applied to all of the control gates by turning off all of the control gate switching means and ground voltage is applied to all of the source regions by turning on all of the source switching means.

14. The nonvolatile memory in accordance with claim 1, wherein the control gates of the nonvolatile memory devices in same rows of the matrix are connected to the control gate line through control gate protection switching means.

15. The nonvolatile memory in accordance with claim 14, wherein read or write operations are carried out by turning on the control gate protection switching means in the column of a selected nonvolatile memory device and turning off other control gate protection switching means.

16. The nonvolatile memory in accordance with claim 1, wherein the drain regions of the nonvolatile memory devices in the same row of the matrix are connected to the drain line through drain protection switching means.

17. The nonvolatile memory in accordance with claim 16, wherein read or write operations are carried out by turning on the drain protection switching means in the row of a selected nonvolatile memory device and turning off drain protection switching means in other rows.

18. A method of writing to a nonvolatile memory formed by a plurality of nonvolatile memory devices connected in a matrix, each of said nonvolatile memory devices comprising:

a source region of a first conductive type and a drain region of the first conductive type, a channel region of a second conductive type formed between the source and drain regions, a memory gate formed on the channel region and insulated from the channel region, a ferroelectric layer formed on the memory gate, and a control gate formed on the ferroelectric layer; wherein said nonvolatile memory comprises:

a drain line connecting the drain regions of each of the plurality of nonvolatile memory devices in a same row of the matrix, a unified drain line connected to each of the drain lines, a control gate line connecting the control gates of each of the plurality of nonvolatile memory devices in a same row of the matrix, a source line connecting the source regions and channel regions of each of the plurality of nonvolatile memory devices in a same column of the matrix, drain switching means for connecting the drain line to, and disconnecting the drain line from, a current judgment means for drain current through the unified drain line, a drain switching means being provided for each drain line and wherein the drain switching means in the drain line connected to a selected nonvolatile memory device turns on and other drain switching means turn off, the method comprising:

connecting the source line connected to a selected nonvolatile memory device to ground;

allowing source lines connected to non-selected nonvolatile memory devices to float;

applying a reference voltage to the control gate lines connected to the non-selected nonvolatile memory devices, said reference voltage being substantially the same as a threshold voltage of the nonvolatile memory device; and applying to the control gate line of the selected nonvolatile memory device either a voltage higher than the reference voltage for polarizing the ferroelectric layer of the selected nonvolatile memory device to a first state or a voltage lower than the reference voltage than the reference voltage for polarizing the ferroelectric layer of the selected nonvolatile memory device to a second state.

19. A method of reading a nonvolatile memory formed by a plurality of nonvolatile memory devices connected in a matrix, each of said nonvolatile memory devices comprising:

a source region of a first conductive type and a drain region of the first conductive type, a channel region of a second conductive type formed between the source and drain regions, a memory gate formed on the channel region and insulated from the channel region, a ferroelectric layer formed on the memory gate, and a control gate formed on the ferroelectric layer; wherein said nonvolatile memory comprises:

a drain line connecting the drain regions of each of the plurality of nonvolatile memory devices in a same row of the matrix, a unified drain line connected to each of the drain lines, a control gate line connecting the control gates of each of the plurality of nonvolatile memory devices in a same row of the matrix, a source line connecting the source regions and channel regions of each of the plurality of nonvolatile memory devices in a same column of the matrix, drain switching means for connecting the drain line to, and disconnecting the drain line from, a current judgment means for drain current through the unified drain line, a drain switching means being provided for each drain line; and wherein the drain switching means in the drain line connected to a selected nonvolatile memory device turns on and other drain switching means turn off, the method comprising:

connecting the source line connected to a selected nonvolatile memory device to ground;

allowing source lines connected to non-selected nonvolatile memory devices to float;

applying to all of the control gate lines a reference voltage which is substantially the same as a threshold voltage of the nonvolatile memory device; and judging whether current capacity of the drain line is larger or smaller than a reference current.

20. A method of setting a nonvolatile memory to standby, the nonvolatile memory being formed by a plurality of nonvolatile memory devices connected in a matrix, each of said nonvolatile memory devices comprising:

a source region of a first conductive type and a drain region of the first conductive type, a channel region of a second conductive type formed between the source and drain regions, a memory gate formed on the channel region and insulated from the channel region, a ferroelectric layer formed on the memory gate, and a control gate formed on the ferroelectric layer; wherein said nonvolatile memory comprises:

a drain line connecting the drain regions of each of the plurality of nonvolatile memory devices in a same row of the matrix, a unified drain line connected to each of the drain lines, a control gate line connecting the control gates of each of the plurality of nonvolatile memory devices in a same row of the matrix, a source line connecting the source regions and channel regions of each of the plurality of nonvolatile memory devices in a same column of the matrix, drain switching means for connecting the drain line to, and disconnecting the drain line from, a current judgment means for drain current through the unified drain line, a drain switching means being provided for each drain line; and wherein the drain switching means in the drain line connected to a selected nonvolatile memory device turns on and other drain switching means turn off, the method comprising:

applying a reference voltage to all control gate lines, said reference voltage being substantially the same as a threshold voltage of the nonvolatile memory device; and applying all source lines to ground.

21. A method of operating a nonvolatile memory formed by a plurality of nonvolatile memory devices connected in a matrix, each of said nonvolatile memory devices comprising:

a source region of a first conductive type and a drain region of the first conductive type, a channel region of a second conductive type formed between the source and drain regions, a memory gate formed on the channel region and insulated from the channel region, a ferroelectric layer formed on the memory gate, and a control gate formed on the ferroelectric layer; wherein said nonvolatile memory comprises:

a drain line connecting the drain regions of each of the plurality of nonvolatile memory devices in a same row of the matrix, a unified drain line connected to each of the drain lines, a control gate line connecting the control gates of each of the plurality of nonvolatile memory devices in a same row of the matrix, a source line connecting the source regions and channel regions of each of the plurality of nonvolatile memory devices in a same column of the matrix, drain switching means for connecting the drain line to, and disconnecting the drain line from, a current judgment means for drain current through the unified drain line, a drain switching means being provided for each drain line and wherein the drain switching means in the drain line connected to a selected nonvolatile memory device turns on and other drain switching means turn off, the method comprising:

(a) writing to the nonvolatile memory, comprising the steps of:

connecting the source line connected to a selected nonvolatile memory device to ground;

allowing source lines connected to non-selected nonvolatile memory devices to float;

applying to the control gate lines connected to the non-selected nonvolatile memory devices a reference voltage which is substantially the same as a threshold voltage of the nonvolatile memory device; and applying to the control gate line of the selected nonvolatile memory device either a voltage higher than the reference voltage for polarizing the ferroelectric layer of the selected nonvolatile memory device to a first state or a voltage lower than the reference voltage than the reference voltage for polarizing the ferroelectric layer of the selected nonvolatile memory device to a second state;

(b) reading from the nonvolatile memory, comprising the steps of:

connecting the source line connected a selected nonvolatile memory device to ground;

allowing source lines connected to non-selected nonvolatile memory devices to float;

applying the reference voltage to all of the control gate lines; and judging whether current capacity of the drain line is larger or smaller than a reference current; and (c) setting the memory to standby, comprising the steps of:

applying the reference voltage to all control gate lines; and applying all source lines to ground.

* * * * *

UNITED STATES PATENT AND TRADEMARK OFFICE
CERTIFICATE OF CORRECTION

PATENT NO. : 5,541,871

DATED : July 30, 1996

INVENTOR(S) : Nishimura et al.

It is certified that error appears in the above-identified patent and that said Letters Patent is hereby corrected as shown below:

Abstract, line 8, "$V_{cc}$" should be --$V_{cg}$--.

In column 3, line 7, "applied the voltage" should be --the voltage applied--.

In column 3, line 28, "the" should be --there--.

In column 4, line 4, "is" should read --are--.

In column 5, line 44, "Write" should be --write--;

line 62, "no" should be --a--.

In column 7, line 5, "Control" should be --control--.

Signed and Sealed this

Fourth Day of February, 1997

Attest:

BRUCE LEHMAN

*Attesting Officer*  *Commissioner of Patents and Trademarks*